US006726429B2

(12) United States Patent
Sackett et al.

(10) Patent No.: US 6,726,429 B2
(45) Date of Patent: Apr. 27, 2004

(54) LOCAL STORE FOR A WAFER PROCESSING STATION

(75) Inventors: James G. Sackett, Santa Clara, CA (US); David E. Weldon, Santa Clara, CA (US); H. Alexander Anderson, Santa Cruz, CA (US)

(73) Assignee: Vertical Solutions, Inc., San Jose, CA (US)

( * ) Notice: Subject to any disclaimer, the term of this patent is extended or adjusted under 35 U.S.C. 154(b) by 0 days.

(21) Appl. No.: 10/079,025

(22) Filed: Feb. 19, 2002

(65) Prior Publication Data

US 2003/0156928 A1 Aug. 21, 2003

(51) Int. Cl.[7] .............................................. B65G 49/07
(52) U.S. Cl. .................. 414/217; 414/282; 414/331.07; 414/331.11; 414/331.14; 414/331.16; 414/331.18; 414/939; 414/940
(58) Field of Search ................................. 414/217, 939, 414/940, 268, 269, 281, 282, 331.11, 331.16, 331.07, 331.14, 331.18

(56) References Cited

U.S. PATENT DOCUMENTS

| 3,075,656 A | * | 1/1963 | Pearne ................... 414/331.18 |
| 3,637,095 A | * | 1/1972 | Kampfer ................. 414/280 X |
| 4,544,318 A | | 10/1985 | Nagatomo et al. ............ 414/222 |
| 4,676,709 A | | 6/1987 | Bonora et al. ............. 414/217 |
| 4,682,927 A | * | 7/1987 | Southworth et al. ........ 414/217 |
| 4,826,360 A | | 5/1989 | Iwasawa et al. ............. 406/51 |
| 4,859,137 A | | 8/1989 | Bonora et al. .............. 414/648 |
| 4,875,825 A | | 10/1989 | Tullis et al. ................ 414/786 |
| 4,923,353 A | | 5/1990 | Tullis et al. ................ 414/226 |
| 4,986,715 A | | 1/1991 | Asakawa .................... 414/331 |
| 5,203,661 A | * | 4/1993 | Tanita et al. ............. 414/280 X |
| 5,387,265 A | | 2/1995 | Kakizaki et al. ........... 29/25.01 |
| 5,409,348 A | | 4/1995 | Suzuki ....................... 414/786 |
| 5,417,537 A | | 5/1995 | Miller ........................ 414/217 |
| 5,431,600 A | | 7/1995 | Murata et al. .............. 454/187 |
| 5,536,128 A | | 7/1996 | Shimoyashiro et al. ..... 414/273 |

(List continued on next page.)

OTHER PUBLICATIONS

Semi E1.9–0701, "Mechanical Specification for Cassettes Used to Transport and Store 300 mm Wafers", Semi E1.9–0701 © 1994, 2001, pp. 1–22.

(List continued on next page.)

Primary Examiner—Steven A. Bratlie
(74) Attorney, Agent, or Firm—Silicon Valley Patent Group LLP

(57) ABSTRACT

A buffer apparatus includes a vertically moving mechanism containing a plurality of horizontally moving mechanisms to store carriers and transfer carriers to and from a load port, and one or more buffer load ports adjacent to the buffer apparatus to charge and uncharge the buffer apparatus by means of a guided vehicle, an overhead vehicle, or a human. A buffer system includes a buffer apparatus and a processing system load port to transfer carriers from the buffer apparatus to a processing system load port. An arrayed buffer system includes a plurality of buffer systems where each buffer system interacts with an individual set of load ports or a pair of buffer systems interacts with a shared set of load ports. A combination of arrayed buffer systems includes a plurality of adjacent arrayed buffer systems capable of sharing a single, environmental front-end mechanism maintenance space and capable of being serviced from the front.

17 Claims, 34 Drawing Sheets

U.S. PATENT DOCUMENTS

| | | | | |
|---|---|---|---|---|
| 5,570,990 A | * | 11/1996 | Bonora et al. | 414/543 |
| 5,601,484 A | | 2/1997 | Adler et al. | 454/187 |
| 5,611,452 A | | 3/1997 | Bonora et al. | 220/378 |
| 5,628,604 A | | 5/1997 | Murata et al. | 414/225 |
| 5,655,869 A | * | 8/1997 | Scheler et al. | 414/222 |
| 5,664,925 A | | 9/1997 | Muka et al. | 414/217 |
| 5,673,804 A | | 10/1997 | Weiss et al. | 212/274 |
| 5,713,711 A | | 2/1998 | McKenna et al. | 414/217 |
| 5,715,749 A | * | 2/1998 | Miller | 101/216 |
| 5,715,929 A | | 2/1998 | Scheler et al. | 198/375 |
| 5,741,109 A | | 4/1998 | Wiesler et al. | 414/416 |
| 5,772,386 A | * | 6/1998 | Mages et al. | 414/939 X |
| 5,778,458 A | | 7/1998 | Speelman | 414/786 |
| 5,807,062 A | | 9/1998 | Schultz et al. | 414/44.2 |
| 5,931,631 A | | 8/1999 | Bonora et al. | 414/416 |
| 5,957,648 A | | 9/1999 | Bachrach | 414/217 |
| 5,964,561 A | | 10/1999 | Marohl | 414/217 |
| 5,967,740 A | | 10/1999 | Pflueger et al. | 414/750 |
| 5,976,199 A | | 11/1999 | Wu et al. | 29/25.01 |
| 5,980,183 A | | 11/1999 | Fosnight | 414/222.01 |
| 5,984,610 A | | 11/1999 | Rush et al. | 414/416 |
| 5,995,857 A | | 11/1999 | Kwon et al. | 318/568.11 |
| 6,000,732 A | | 12/1999 | Scheler et al. | 292/68 |
| 6,019,563 A | | 2/2000 | Murata et al. | 414/222.01 |
| 6,025,602 A | * | 2/2000 | Rose et al. | 250/492.21 |
| 6,033,175 A | | 3/2000 | Pflueger et al. | 414/401 |
| 6,042,324 A | | 3/2000 | Aggarwal et al. | 414/411 |
| 6,050,768 A | | 4/2000 | Iwasaki et al. | 414/222.01 |
| 6,068,104 A | | 5/2000 | Pflueger et al. | 198/345.3 |
| 6,079,927 A | | 6/2000 | Muka | 414/217 |
| 6,102,647 A | * | 8/2000 | Yap | 414/539 |
| 6,135,698 A | | 10/2000 | Bonora et al. | 414/416 |
| 6,138,694 A | | 10/2000 | Hansen et al. | 134/58 R |
| 6,151,533 A | * | 11/2000 | Iwasaki et al. | 700/214 |
| 6,169,935 B1 | | 1/2001 | Iwasaki et al. | 700/214 |
| 6,223,886 B1 | | 5/2001 | Bonora et al. | 198/465.2 |
| 6,253,118 B1 | | 6/2001 | Koyama | 700/218 |
| 6,280,134 B1 | | 8/2001 | Nering | 414/217 |
| 6,283,692 B1 | | 9/2001 | Perlov et al. | 414/222.01 |
| 6,308,818 B1 | | 10/2001 | Bonora et al. | 198/465.1 |
| 2001/0043849 A1 | | 11/2001 | Perlov et al. | 414/222.01 |

OTHER PUBLICATIONS

Semi E15–0698, "Specification for Tool Load Port", Semi E15–0698 © 1990, 1998, pp. 1–6.

Semi E15–0600, "Specification for 300 mm Tool Load Port", © Semi E15.1–0600 1996, 2000, pp. 1–11.

Semi E19–0697, "Standard Mechanical Interface (SMIF)", © Semi E19–0697 1991, 1997, pp. 1–5.

Semi E–47.1101, "Provisional Mechanical Specification for Boxes and Pods Used to Transport and Store 300 mm Wafers", SEMI E47.1–1101 © Semi 1997, 2001, pp. 1–21.

Semi E57–0600, "Mechanical Specification for Kinematic Coupling Used to Align and Support 300 mm Wafer Carriers", Semi E57–0600 © Semi 1996, 2000, pp. 1–7.

Semi E63–0600A, Mechanical Specification for 300 mm Box Opener/Loader to Tool Standard (Boldts–M) Interface, Semi E63–0600A © Semi 1997, 2000, pp. 1–7.

Semi E64–0600, "Specification for 300 mm Cart to Semi E15.1 Docking Interface Port", Semi E64–0600 © Semi 1997, 2000, pp. 1–5.

Semi E82–1101, "Specification for Interbay/Intrabay AMHS Sem (IBSEM)", Semi E82–1101 © Semi 1999, 2001, pp. 1–50.

Semi E83–1000, Specification for 300 mm PGV Mechanical Docking Flange, Semi E83–1000 © Semi 1999, 2000, pp. 1–4.

Semit E85–1101, "Specification for Physical AMHS Stocker Interbay Transport System Interoperability", Semit E85–1101 © Semi 1999, 2001. pp. 1–27.

P. Gargini et al., "Factory Considerations for High Volume Manufacturing Using 300 mm Wafers", Intel STSS '97.

D. Pillai et al., "Integration of 300 mm FAB Layouts and Material Handling Automation", Intel ISSM '99, pp 1–4.

D. Pillai, "Integrated Factory Designs Using Modeling and Simulation", Intel Solutions '99 Conference, Mar. 23, 1999, pp. 1–13.

Sohn et al..., "300 mm Factory Design for Operational Effectiveness", Intel, pp. 1–28.

D. Pillai et al., "Material Handling Automation Trends, Vision and Future Plans", Proceedings form ISSM '96, Tokyo, Japan, pp. 1–4.

J. Ferrel et al., I3001 Factory Guidelines: Version 5.0, Technology Transfer #9706311G–ENG, Int'l Samantech, Apr. 28, 2000, pp. Cover page, 1–86.

L. Christal, "300 mm Best–Known Practices (300 bkp) for 300 mm Factory Integration" Technology Transfer #00214063A–ENG, Int'l Samantech, Mar. 30, 2001, pp. 1–75.

E. Bass et al., Metrics for 300 mm Automated Material Handling . . . , Rev. 1.0, Technology Transfer #97123416B–TR, Int'l Samantech, Dec. 15, 1998, pp. 1–24.

E. Campbell et al., Dynamic Factory Modeling Person Guided Vehicle (PGV) Report, Technology Transfer #00033920A–ENG, Int'l Samantech, Mar. 31, 2000, pp. 1–43.

E. Campbell et al., 300 mm Factory Layout and Material Handling Modeling: Phase II Report, Technology Transfer # 99113848B–ENG, Int'l Samantech, Jun. 30, 2000, pp. 1–61.

K. Gartland, Automated Material Handling Systems (AMHS) Framework User Requirements Document: Version 1.0, Technology Transfer # 99073793 A–TR, Int'l Samantech, Sep. 15, 1999, pp. 1–44.

I3001 Guidelines on 300 mm Process Tool Mechanical Interfaces for Wafer Lot Delivery, Buffering, and Loading (REV. D, Sep. 3, 1996), Int'l 300 mm Initiative, Technology Transfer # 97063298A–XFR, 6 pages.

"Factory Integration", International Technology Roadmap for Semiconductors 1999 Edition, Factory Integration, pp. Cover page, i–ii, 188–212.

"Factory Integration". International Technology Roadmap for Semiconductors 2000 Update, Integration, pp. Cover page, Table of Contents, 1–12.

* cited by examiner

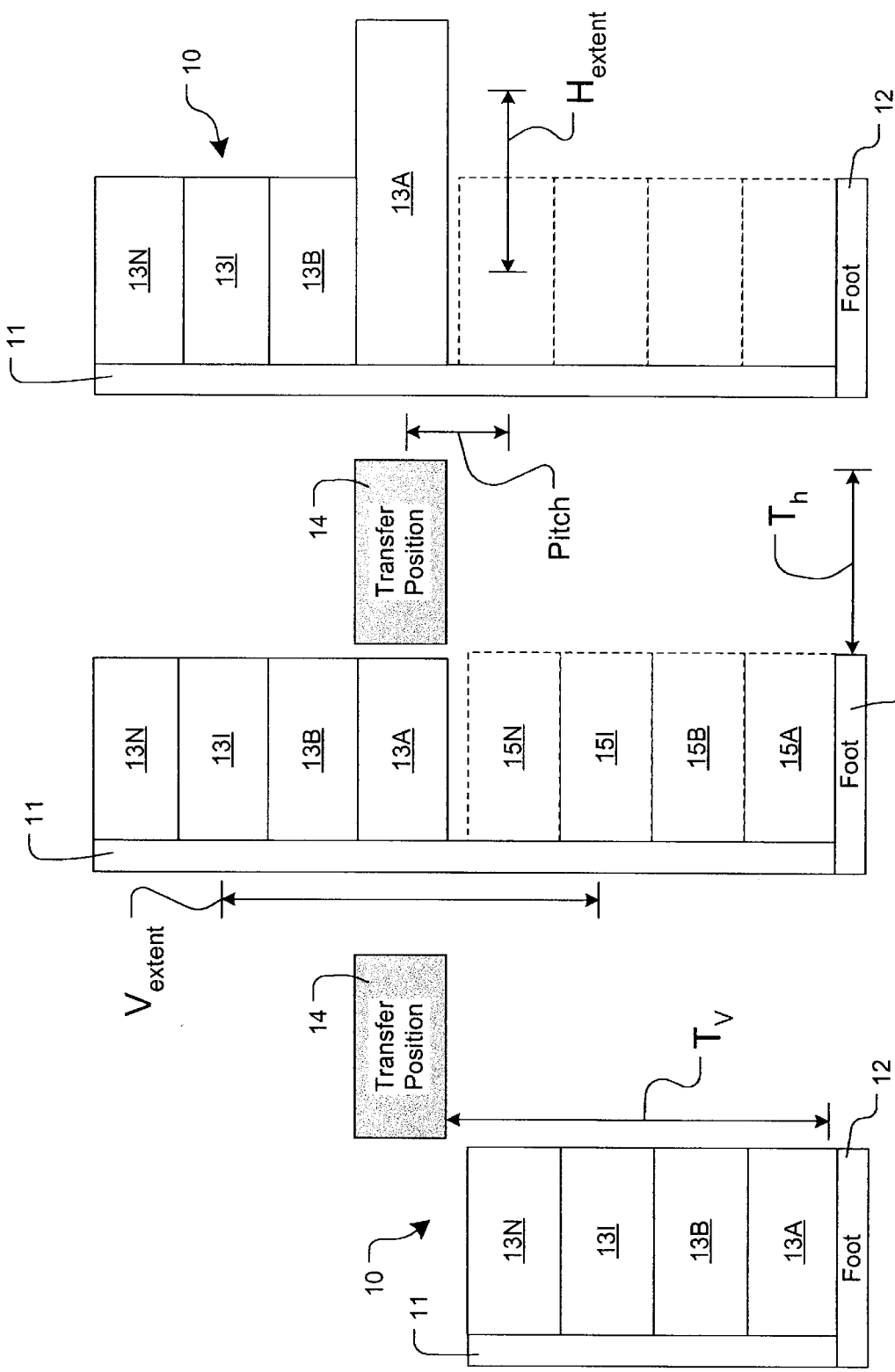

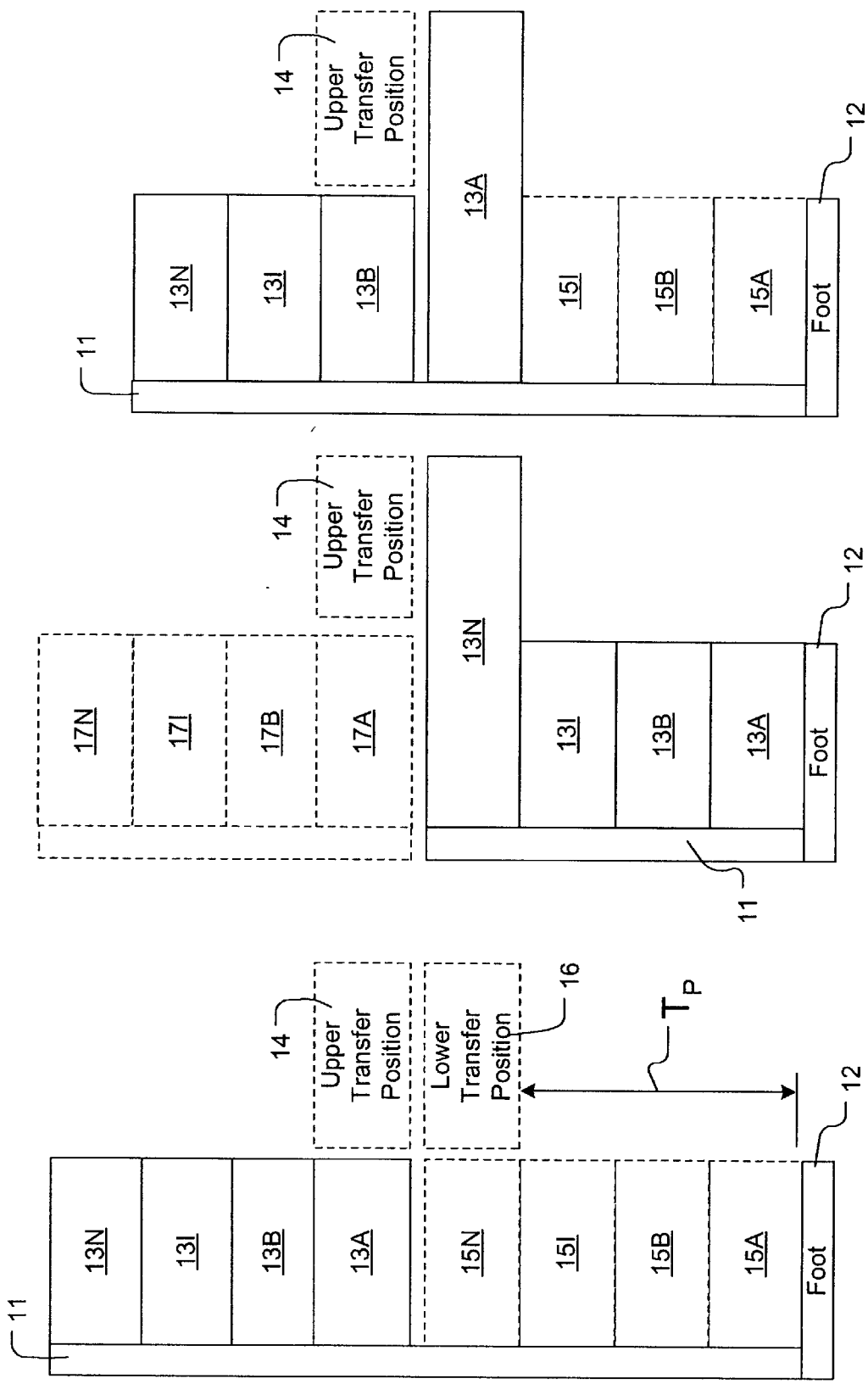

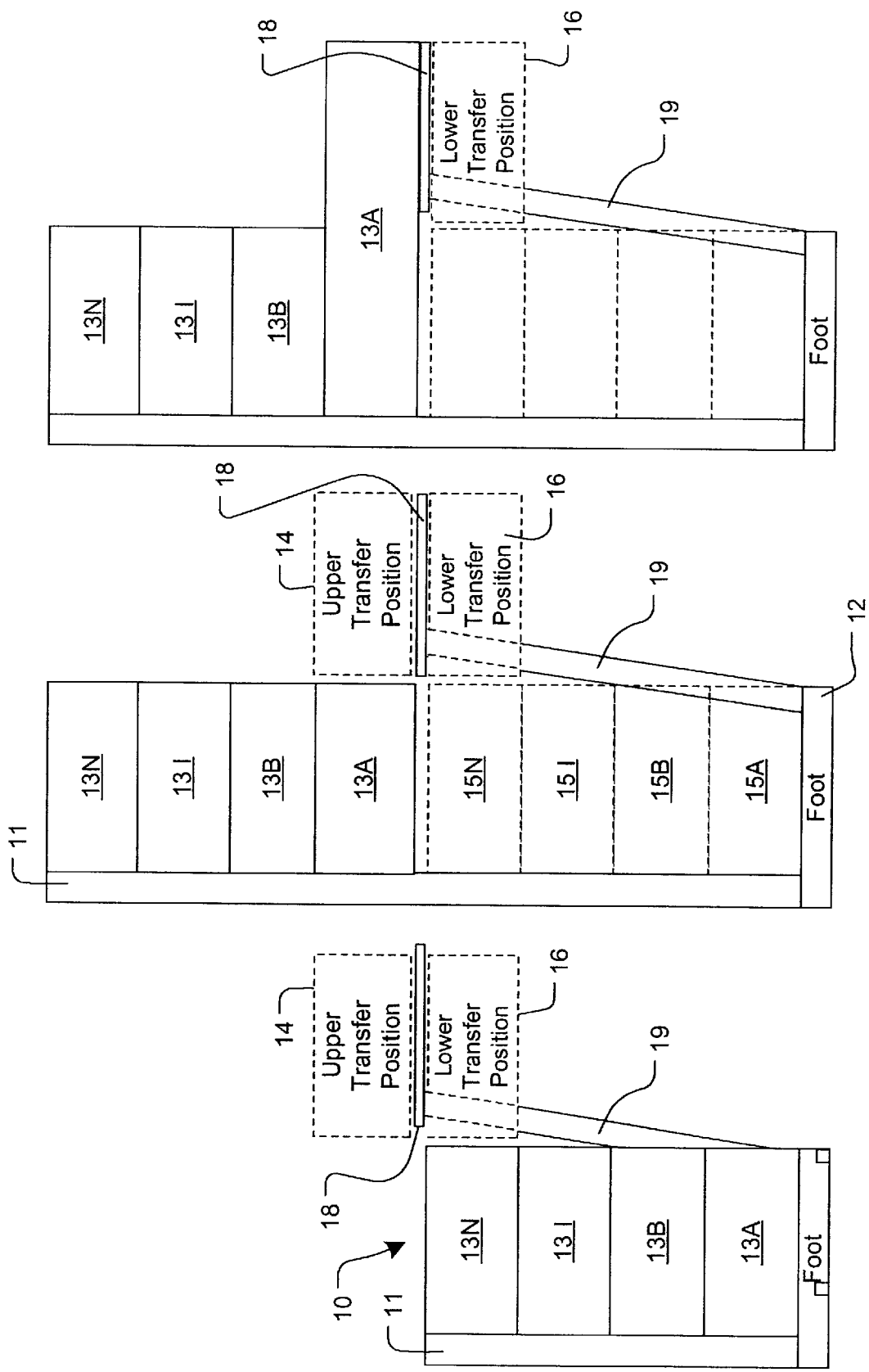

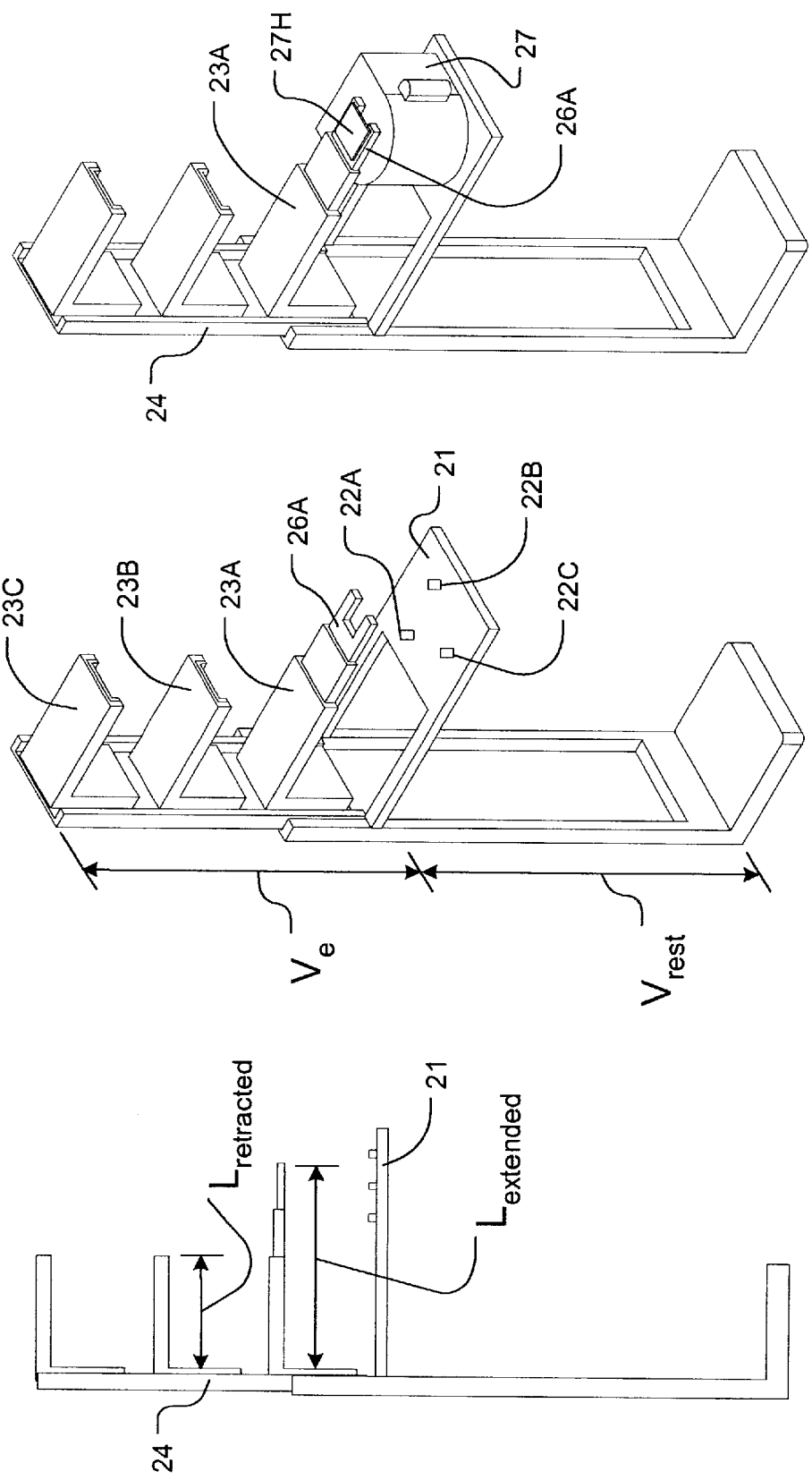

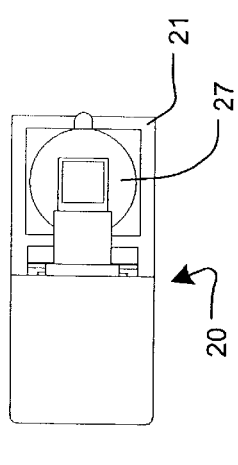
FIG. 6B
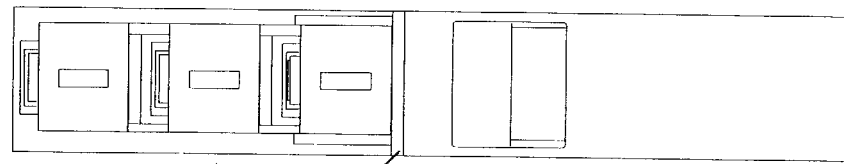
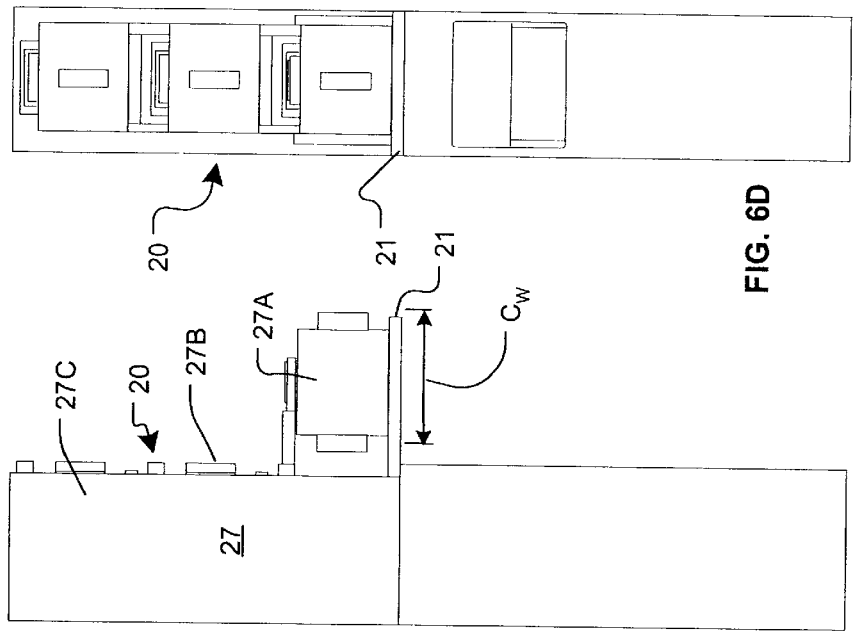
FIG. 6C
FIG. 6D
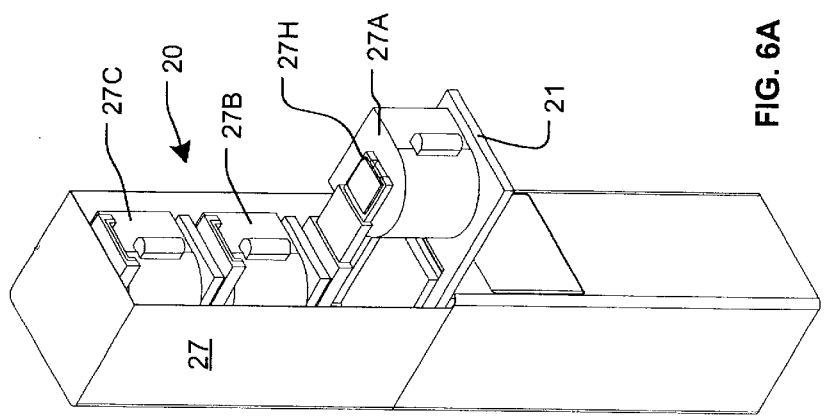
FIG. 6A

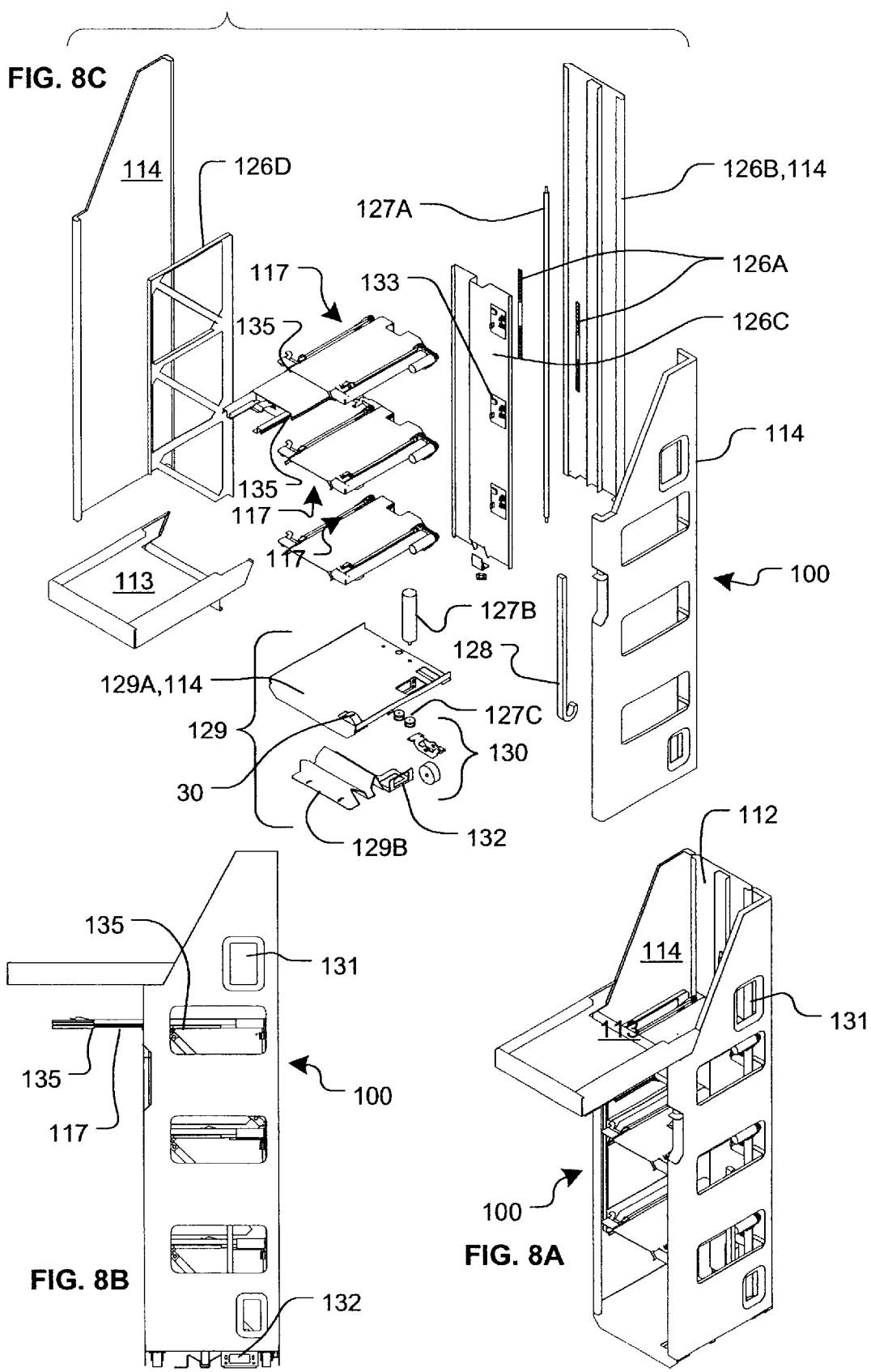

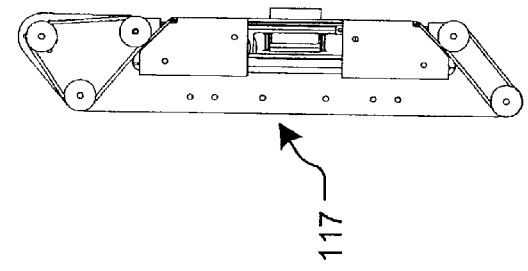
FIG. 9D
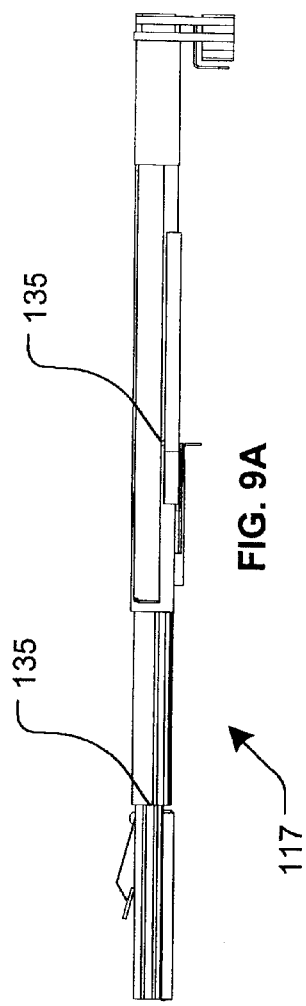
FIG. 9A
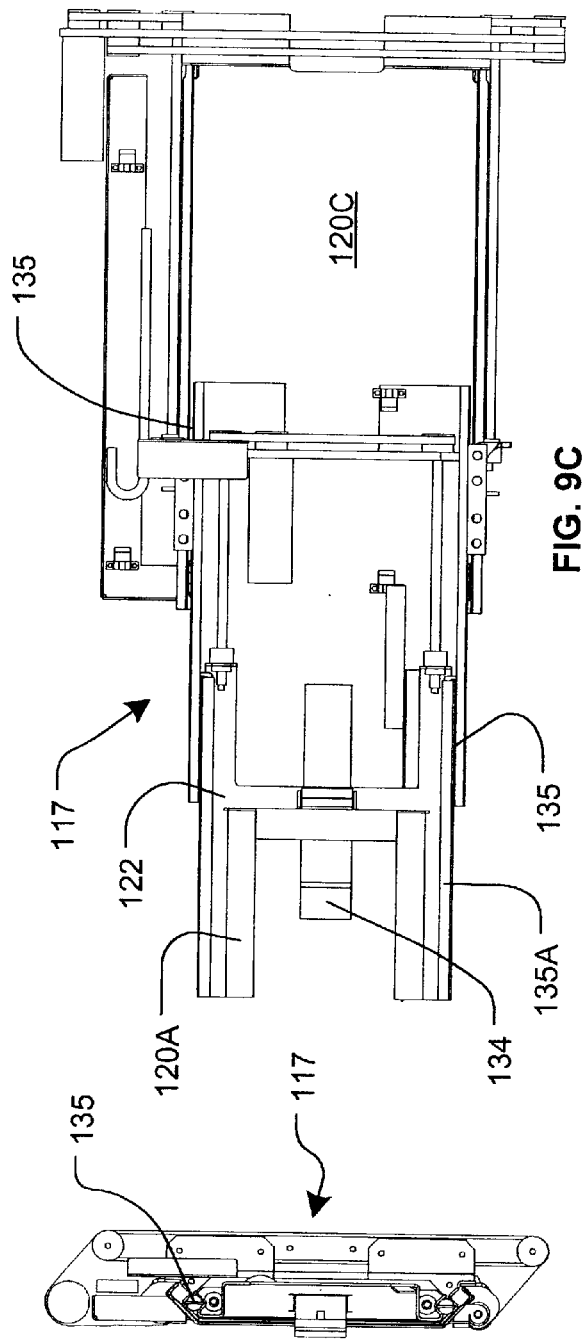
FIG. 9C
FIG. 9B

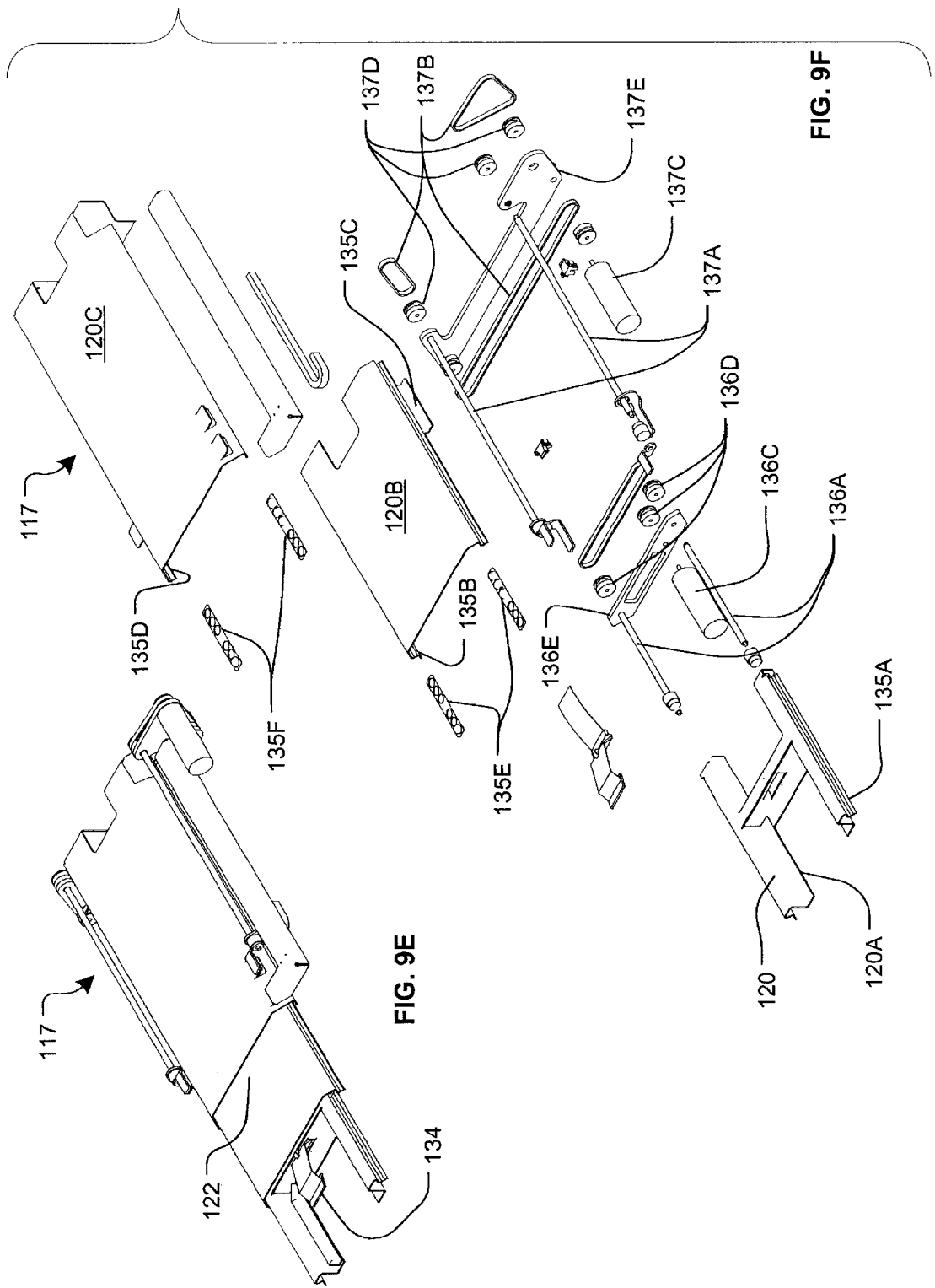

LOCAL STORE FOR A WAFER PROCESSING STATION

FIELD OF THE INVENTION

The present invention relates to storage of boxes and in particular to an apparatus for locally buffering boxes (also called "carriers" or "cassettes") of semiconductor wafers at or near one or more processing stations in a integrated circuit fabrication system.

BACKGROUND

Integrated circuit (commonly abbreviated as "IC") dies are manufactured by performing a number of steps on a semiconductor wafer (also called "substrate") in a fabrication system (commonly abbreviated as "fab"). Wafers are normally held in a central store 1 (commonly called "stocker"), and are transported to one or more processing stations 2A–2M (wherein A≦J≦M, M being the total number of processing stations). During transportation, a number of wafers are held in a box 3 (also called "carrier", "cassette", "SMIF", "box", "pod", "FOUP" and "transporting container"). The size of a carrier depends on the maximum number of wafers that can be held therein, and prior art discloses carriers for holding 13 wafers as well as more recent carriers for holding up to 25 wafers, or as few as one wafer.

As illustrated in FIG. 1A, a carrier 3 may be picked up from stocker 1 by an overhead vehicle 4 (commonly abbreviated as "OHV"), and transported to any of processing stations 2A–2M (also called "processing systems" or "process tool") depending on the fabrication step that is to be performed thereon. Instead of an OHV 4, carriers may also be carried manually, or alternatively by an automated guided vehicle (not shown in FIG. 1A; commonly abbreviated as "AGV"), by a personal guided vehicle (also not shown in FIG. 1A; abbreviated as "PGV") or by a rail guided vehicle (also not shown in FIG. 1A; abbreviated as "RGV").

U.S. Pat. No. 6,283,692 granted to Perlov, et al. (which is incorporated by reference herein in its entirety as background) states that "In order to ensure that the processing equipment does not sit idle, a nearly continuous supply of unprocessed substrates should be available at the processing station. Unfortunately, many processing stations can hold only a single cassette at the loading platform. Therefore, once all of the substrates in the cassette have been processed, the cassette must be quickly replaced, either manually or by an AGV, with a new cassette containing unprocessed substrates. Unfortunately, running such a just-in-time cassette inventory system requires either significant operator oversight or a large number of AGVs, thereby increasing the costs of the fabrication facility. Therefore, there is a need for a method and apparatus which continuously supplies substrate cassettes to a processing system so that system down time is reduced or eliminated." See column 1, lines 34–45.

Perlov, et al. propose "a method and apparatus for storing multiple cassettes at a processing station, ensuring that a nearly continuous supply of unprocessed substrates is available for processing and that the processing equipment does not sit idle. Multiple cassettes can be stored at a processing station in a front-end support frame and a cassette can be moved to a docking station where substrates are extracted and transferred to the processing equipment. An automation system is mounted or otherwise disposed on the frame to transfer cassettes between docking stations or between processing stations. The apparatus does not increase the footprint, i.e., the required area on the cleanroom floor, of the processing station. In another aspect of the invention, cassettes can be transported between different processing stations without the use of an AGV." See column 1, lines 53–67.

Referring to FIG. 1A, after transportation, each carrier is placed on a box opener/loader 5 (also called "load port" or "box opener") located in front of a processing station 2A. Each box opener/loader/loader 5 opens a lid of the carrier, so that wafers inside the carrier can be extracted by a robot located in an enclosure of processing station 2A. The enclosure provides a nearly particle-free environment in which wafers may be handled, as required by, for example, International SEMATECH, located at 2706 Montopolis Drive, Austin Tex. 78741, "I300I Factory Guidelines: Version 5.0" (which is incorporated by reference herein in its entirety as background). See section 2.7.

Depending on the throughput of various processing stations 2A–2M and also depending on the order in which processing stations 2A–2M are used during fabrication, one, two or even four box opener/loader/loaders may be provided in front of a processing station, as illustrated in FIG. 1A. Although each box opener/loader/loader is illustrated in FIG. 1A as being capable of supporting only one carrier, it is possible for a box opener/loader/loader (also called "loading and unloading station") to support two carriers, as described by, for example, U.S. Pat. No. 5,772,386 granted to Mages et al. (which is incorporated by reference herein in its entirety as background).

SUMMARY

In some embodiments of the invention, a store having its own footprint separate and distinct from any of the above-described items is provided locally at a processing station, for example, in a fab for integrated circuit dies. The store (also called "buffer apparatus") is located adjacent to a box opener/loader that in turn is adjacent to the processing station. The buffer apparatus transfers boxes one at a time to/from the box opener/loader that in turn opens each box and wafers therein may be transferred to/from the processing station. In such embodiments, the buffer apparatus transfers a box to/from a box opener/loader directly, without an intermediary (such as a human, an OHV, an AGV, a RGV or a PGV) between the box opener/loader and the buffer apparatus. Depending on the embodiment, the buffer apparatus may transfer boxes to/from such an intermediary (in addition to or instead of transferring the boxes to/from a box opener/loader).

One embodiment of such a stand-alone buffer apparatus includes two types of mechanisms that respectively move a box (also called "carrier") vertically and horizontally to/from a position of storage (also called "storage position") within the apparatus. Specifically, a mechanism (hereinafter "vertically moving mechanism") that is itself capable of moving vertically is fixedly attached to a foot, and in addition a number of mechanisms (hereinafter "horizontally moving mechanisms") that are each capable of moving horizontally are attached to the vertically moving mechanism. Although in the just-described embodiment, a single mechanism moves all the horizontally moving mechanisms in unison during any vertical movement of a carrier, in alternative embodiments each horizontally moving mechanism may be moved vertically independent of the vertical movement of another horizontally moving mechanism.

Several embodiments of the buffer apparatus move a carrier between the above-described storage position and a predetermined position (called "transfer position") that is located outside of the volume occupied by the buffer apparatus. The transfer position is separated from the foot in the horizontal direction by a distance called "horizontal extent" and in the vertical direction by another distance called "vertical extent."

During a storage operation, the buffer apparatus moves a carrier from the transfer position through the horizontal extent, and thereafter moves the carrier vertically into a storage position. These acts are reversed for retrieval of a previously stored carrier. Some embodiments of the above-described buffer apparatus have another transfer position (called "lower transfer position"), which is in addition to the above-described transfer position (called "upper transfer position"). In one such embodiment, the buffer apparatus is designed to transfer a carrier from any storage position to any transfer position. Specifically, the buffer apparatus can transfer a carrier from the lower-most storage position to the upper transfer position, and can also transfer a carrier from the upper-most storage position to the lower transfer position.

A buffer apparatus of the type described above has a number of storage positions (stacked one on top of another) at which a corresponding number of carriers may be stored. To reach a lower-most storage position, several embodiments of the buffer apparatus move a carrier vertically through one or more intermediate storage positions. In these embodiments, space used for storage of objects within such a buffer apparatus is also used for transport of objects vertically.

Dual use of the same space allows a buffer apparatus to occupy a small footprint (as compared to use of two spaces, each distinct from the other, for storage and for transport respectively, which would effectively double the footprint). The small size of the footprint of a buffer apparatus provides significant cost savings, e.g. in fabs where floor space in a cleanroom commands a premium. In one embodiment, the footprint of a buffer apparatus is made as small as possible, e.g. as small as the footprint of a box opener/loader, although in other embodiments a larger footprint box apparatus is used.

Although described in the context of a fab, such a buffer apparatus may also be used in non-fab environments, for objects other than carriers.

BRIEF DESCRIPTION OF DRAWINGS

FIGS. 2A–2C illustrate schematic representations of a buffer apparatus in accordance with the invention.

FIGS. 3A–3C illustrate schematic representations of the buffer apparatus of FIGS. 2A–2C with a shelf FIGS. 4A–4C illustrate schematic representations of the buffer apparatus of FIGS. 3A–3C servicing a transfer position under the shelf.

FIGS. 5A, 5E, 5F illustrate in three dimensional perspective views and FIGS. 5E, 5C, 5D, and 5G–5L illustrate in side views, one specific embodiment of a buffer apparatus of the type illustrated in FIGS. 4A–4C.

FIGS. 6A, 6B, 6C and 6D illustrate, in a perspective view, a top view, a side view and a front view respectively, the buffer apparatus of FIGS. 5A–5L enclosed in a housing.

FIGS. 8A–8C illustrate, in a side view, a perspective view and an exploded view respectively, implementation details of one specific example of the buffer apparatus.

FIGS. 9A–9D illustrate, in side view, a front view, a plan view and a rear view, one example of a horizontally moving mechanism used in the buffer apparatus of FIGS. 8A–8C.

FIGS. 9E and 9F illustrate, in a perspective view and an exploded view respectively, the horizontally moving mechanism of FIGS. 9A–9C.

DETAILED DESCRIPTION

Figure 1A:
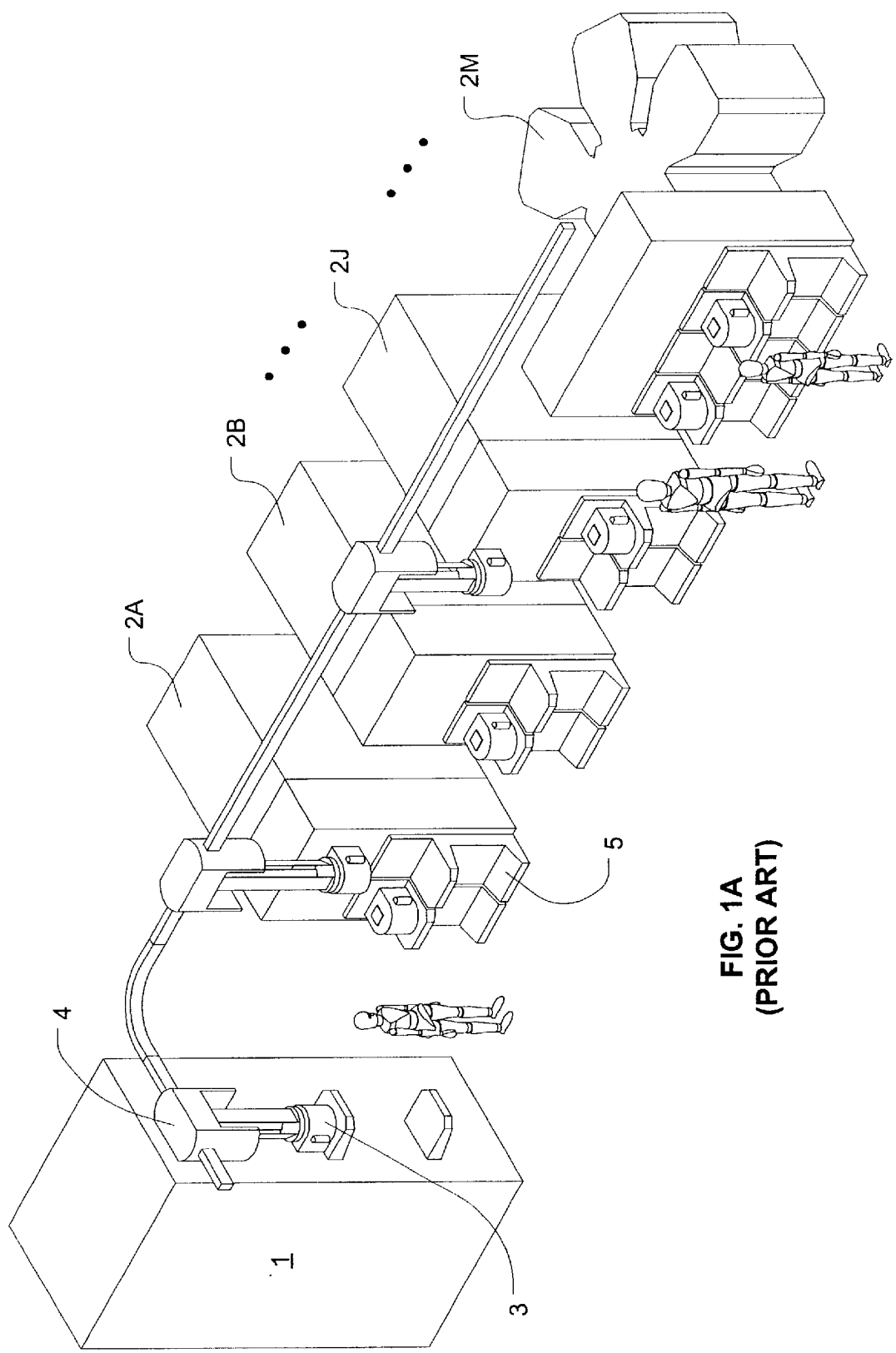
FIG. 1A is a three dimensional perspective view of a fabrication system of the prior art.

In accordance with the invention, a store that is smaller than and separate and distinct from a centralized stocker of the prior art (see FIG. 1A) is provided locally at a processing station, for example, in a fab for integrated circuit (IC) dies. The store is dedicated to the local storage of objects (such as carriers) in an area next to the processing station. The locally stored objects may be immediately worked on by the processing station, thereby eliminating any down time in usage of the processing station. Therefore, the local store (also called "buffer apparatus") provides short-term buffering of objects that are about to be used in (or have just been used by) the processing station. For an IC fab, the term "buffer apparatus" covers any apparatus capable of storing and transferring a number of carriers to and from a load port. Use of such a buffer apparatus decreases the AMHS (also called "automated material handling system") complexity by decreasing the delivery time burden.

One embodiment of a buffer apparatus 10 (FIG. 2A) includes two types of mechanisms that respectively move vertically and horizontally. Specifically, a mechanism 11 (also called "vertically moving mechanism") capable of moving vertically is fixedly attached to a foot 12, and in addition a number of mechanisms 13A–13N (wherein A≦I≦N, N being the total number of such mechanisms) that are capable of moving horizontally are attached to vertically moving mechanism 11. The number N depends on the specific application in which buffer apparatus 10 is used, and on the dimensions of objects that are to be stored therein.

The specific design of mechanisms 11 and 13A–13N may differ, depending on the embodiment, although many embodiments use at least three types of parts: guides, bearings and drives. Examples of guides that may be used in such mechanisms include, but are not limited to an integrated slide and carriage, a telescopic slide, or a scissors mechanism. Examples of bearings that may be used in such mechanisms include, but are not limited to linear bearings, ball bearings, slider bearings, hydrostatic bearings, or roller bearings. Examples of drives that may be used in such mechanisms include, but are not limited to a lead screw driven by an electric motor, a pneumatic cylinder, a cable and pulley mechanism driven by an electric motor, or a belt driven by an electric motor with the appropriate motion control system.

Although certain examples are set forth above, any prior art mechanisms that move linearly, may be combined by a skilled artisan in view of this disclosure to form an apparatus including a vertically moving mechanism 11 and multiple horizontally moving mechanisms 13A–13N as described herein. One or more items used to implement mechanism 11 may be of the same type as or of a different type from a corresponding item used to implement mechanism 13A–13N, depending on the embodiment. The design of mechanisms 11 and 13A–13N may depend on a number of factors, such as the weight and dimension of objects to be stored in apparatus 10.

Each mechanism (also called "horizontally moving mechanism") 13I can be moved vertically through a maximum distance Vextent by mechanism 11 as illustrated in FIG. 2A. Each horizontally moving mechanism 13I itself moves horizontally (through a maximum distance Hextent) as illustrated in FIG. 2C. Although in the just-described embodiment, a common vertically moving mechanism 11 moves all the horizontally moving mechanisms 13A–13N in unison during any vertical movement, in alternative embodiments a horizontally moving mechanism 13N may be moved vertically independent of vertical movement of another horizontally moving mechanism, such as mechanism 13I.

As illustrated in FIGS. 2A–2C, buffer apparatus 10 can transfer any object to/from a predetermined position 14 relative to the foot (hereinafter "transfer position"), that is separated from the foot 12 in the horizontal direction by a distance Th and in the vertical direction by a distance Tv, as long as Th<Hextent and Tv<Vextent. Specifically, during operation, buffer apparatus 10 moves the object (after the object is coupled to horizontally moving mechanism 13A) through the horizontal extent Hextent, and thereafter moves the object vertically into one of storage positions 15A–15N.

The amount of vertical movement of an object being stored in apparatus 10 depends on the specific location of storage position 15I. For example, to reach the lower-most storage position 15A, a to-be-stored object is moved through the entire vertical extent (e.g. from the location of mechanism 13A in FIG. 2B to the storage position 15A). In contrast, to reach the upper-most storage position 15N, the object needs to be moved only through a fraction of the vertical extent, wherein the fraction (also called "pitch") is obtained by dividing the vertical extent by the number of storage positions N. Reversal of the acts performed for storage (as described above) results in returning the object from its storage position to transfer position 14.

In some embodiments, space used for storage of objects within apparatus 10 is also used for transport of objects vertically. Such dual use of the same space allows apparatus 10 to occupy a small footprint (as compared to use of two spaces, each distinct from the other, for storage and for transport). The small size of footprint in such an apparatus 10 results in significant cost savings, e.g. in fabs where space in a cleanroom commands a premium.

In one such embodiment, illustrated in FIGS. 2A–2C, to reach the lower-most storage position 15A, buffer apparatus 10 moves a to-be-stored object vertically through the upper-most storage position 15N, and through one or more intermediate storage positions 15I and 15B. During movement of an object to the lower-most storage position 15A, no objects can be present in any storage position 15A–15N. In a similar manner, during movement of an object to the next-to-lowest storage position 15B, an object may be present in the lower-most storage position 15A but no objects can be present in any intermediate storage position 15B and 15I and no object may be present in the upper-most storage position 15N.

As noted above, in the embodiment illustrated in FIGS. 2A–2C, all horizontally moving mechanisms 13A–13N move in unison during any vertical movement. Therefore when an object is being received by mechanism 13B, another object that is already held by mechanism 13A occupies the uppermost storage position 15N. Thereafter, both objects are moved in unison downward into their respective storage positions 15A and 15B. In this example, an object held by mechanism 13A moves through storage positions 15I and 15B, whereas another object held by mechanism 13B moves through storage positions 15N and 15I.

In one embodiment, all storage positions 15A–15N are located at an elevation (from the foot) below the elevation Tv of transfer position 14 (also called "upper transfer position"), so that buffer apparatus 10 can move an object to an additional transfer position 16 (also called "lower transfer position") that is located below the upper transfer position 14, as illustrated in FIG. 3A. For example, lower transfer position 16 may be at an elevation Tp that is approximately the same as the elevation (N−1)*pitch of the upper-most storage position 15N. Therefore, an object in the upper-most storage position 15N can be delivered to lower transfer position 16 (see FIG. 3A) with a minor amount of vertical movement or even without any vertical movement, depending on the embodiment. When present, such minor vertical movement is normally less than the pitch, for example, 25 mm.

Note that delivery of a previously stored object to upper transfer position 14 requires upward movement of the object (see above discussion in reference to FIGS. 2A–2C) through a distance approximately equal to the pitch, if the object is held in the upper-most storage position 15N. Moreover, since an object in any of storage positions 15A–15N can be moved vertically through the distance Vextent, for delivery to upper transfer position 14 (see above discussion in reference to FIGS. 2A–2C), the object can be delivered to lower transfer position 16 by a smaller amount of vertical motion. Specifically, an object in storage position 15A can be moved to lower transfer position 16 (FIG. 3A) as illustrated by the extension of mechanism 13A in FIG. 3C. Therefore, in this embodiment, an object in upper-most storage position 15N can be transferred to lower transfer position 16 (see FIG. 3A) and in addition an object in the lower-most storage position 15A can be transferred to upper transfer position 14 (see FIG. 3C).

In one embodiment, buffer apparatus 10 maintains all mechanisms 11 and 13A–13N retracted (see FIG. 2A) when simply storing objects (or when empty), i.e. when no transfer is occurring. For this reason positions 15A–15N (FIGS. 2B, 3A, and 3C) have been referred to in the above description as "storage" positions. Note that the same apparatus 10 may be maintained in a mirrored configuration wherein positions 17A–17N (FIG. 3B) are the storage positions, and positions 15A–15N (FIG. 3A) are used only during transfer of an object to/from buffer apparatus 10. In such a configuration, vertically moving mechanism 11 is kept extended (see FIG. 3A) when simply storing objects (or when empty), i.e. when no transfer is occurring. In the mirrored configuration, all storage positions 17A–17N (FIG. 3B) are located at elevations above the lower transfer position 16. Therefore, an object in the lower-most storage position 17A is delivered to the upper transfer position 14 with a minor amount of vertical movement (or even with no vertical movement in some embodiments). Delivery of an object to the lower transfer position 16 from the lower-most storage position 17A requires downward movement of approximately the pitch.

Regardless of the configuration in which apparatus 10 is used, in many embodiments an object in any storage position inside apparatus 10 is deliverable to either of the two transfer positions 14 and 16. However, other embodiments may have one or more storage positions (not shown) that are directly reachable only from one of the two transfer positions that are closest. Such embodiments must have at least one storage position (also called "common storage position") in apparatus 10 that is directly reachable from both transfer positions 14 and 16. One or more such common storage positions may be used to shuffle objects between the two transfer positions 14 and 16. Therefore, each storage position may be reached either directly or indirectly from each transfer position, depending on the embodiment.

In one embodiment, buffer apparatus 10 (FIG. 4A) includes a shelf 18 at the upper transfer position 14, and shelf 18 is fixedly attached to foot 12 by a support 19. Shelf 18 is at the same elevation as transfer position 14, so that an object can be placed on or picked up from shelf 18 by any of the horizontally moving mechanisms 13A–13N, by appropriate vertical movement thereof. For example, FIGS. 4B and 4C illustrated horizontally moving mechanism 13A extended to and retracted from the space above shelf 18. As would be apparent to the skilled artisan, in view of the above-described mirrored configuration, it is possible for buffer apparatus 10 of other embodiments to have a shelf 18 at lower transfer position 16 instead of or in addition to the shelf at upper transfer position 14.

Figure 5C:
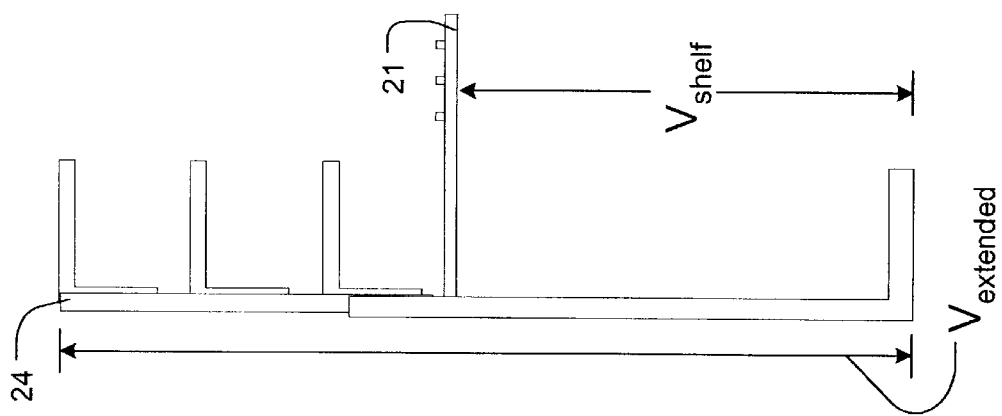

In one embodiment, buffer apparatus 20 (FIG. 5A) is a stand-alone, self-contained unit having its own footprint, which is separate and distinct from the footprint of any other prior art device. For example, the just-described footprint of buffer apparatus 20 defined by dimensions Fw and Fd (FIG. 5A) may be approximately the same as and hence occupy the same area on a cleanroom floor of a fab, as a box opener/loader. In the embodiment of FIG. 5A, the objects being stored in buffer apparatus 20 are carriers of substrates (not shown).

The term "substrate" as used herein covers any object that is being processed in a processing station for semiconductor device fabrication. The term "substrate" includes, but not limited to, for example, semiconductor wafers, reticles, thin-film head wafers, flat panel displays, glass plates or disks, and plastic work pieces. The term "carrier" as used herein covers any device for the holding of substrates processed in a semiconductor device processing station such as a box, pod, cassette, container, boat, etc. as depicted in, but not limited to, U.S. Pat. No. 6,120,229 or as depicted in, but not limited to, SEMI E1-0697; E1.9-0701; E11-0697; E19-0697, -0998, -0996; E47-0301, 0.1-1101; E62-1101; E100-1101; E103-1000; E111-1101; and E112-1101 from Semiconductor Equipment and Materials International located at 3081 Zanker Road, San Jose, Calif. 95134-2127 (each of which is incorporated by reference herein in its entirety as background).

Figure 5B:
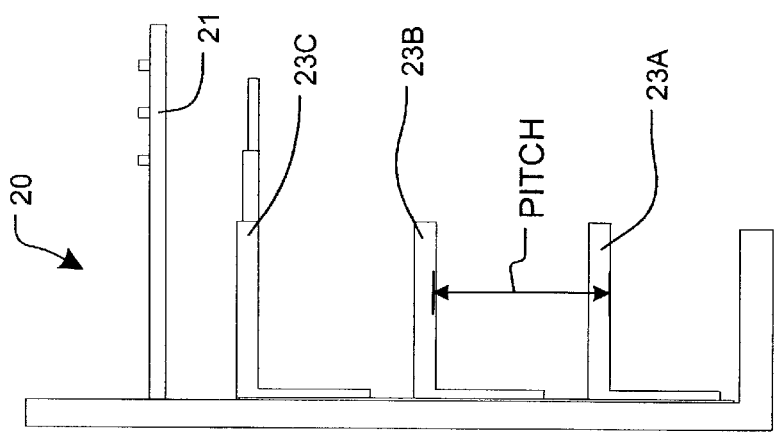
Figure 5A:
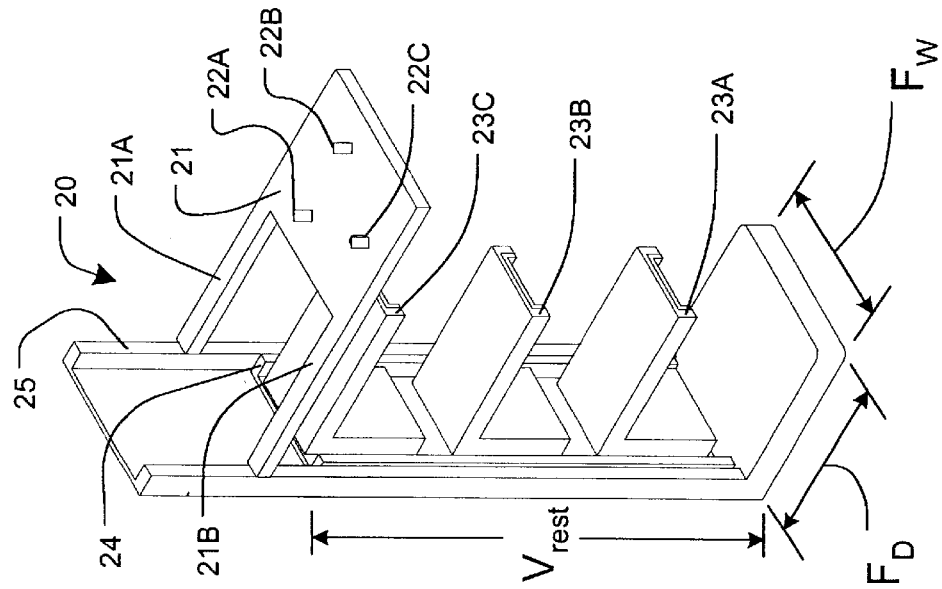

In one specific example that is illustrated in FIG. 5A, N is three (so that three carriers can be stored within apparatus 20), and therefore there are three horizontally moving mechanisms 23A–23C (FIGS. 5A and 5B). In the example of FIG. 5A, each carrier to be used with apparatus 20 can hold 25 substrates, although in other examples other numbers and other dimension objects may be used. Moreover, in the example of FIG. 5A the footprint of buffer apparatus 20 is only 25% greater in area than the corresponding area of a carrier, although in other embodiments other dimensions may be used for buffer apparatus 20.

In the specific example illustrated in FIG. 5A, a shelf at the upper transfer position forms a load port 21 for carriers (e.g. has a kinematic mount formed by pins 22A–22C). The term "load port" covers any interface location on a processing station where carriers are transferred to and from the processing station. It is possible that substrates are not removed from, or inserted into, a carrier at this location. The load port 21 of buffer apparatus 20 is capable of capturing a carrier 27 in a repeatable fashion generally via a kinematic mount as depicted in, but not limited to, U.S. Pat. No. 5,772,386 or as depicted in, but not limited to, SEMI E15-0698, E15.1-0600, E57-0600.

Load port 21 is attached by arms 21A and 21B (FIG. 5A) to a frame 25 in which vertically moving mechanism 24 travels. Arms 21A and 21B are sufficiently apart to define an opening through which horizontally moving mechanisms 23A–23C are able to pass (when retracted) during vertical movement of mechanism 24 into its extended position (see FIG. 5A)

When retracted (FIGS. 5A and 5B), vertically moving mechanism 24 has a height Vrest of, for example, 1290 mm, and this distance is almost doubled when extended to Vextended of, for example, 2590 mm. Note that Vextended is selected to be less than 2600 mm in conformance with the maximum tool height allowed by SEMI. Apparatus 20 has a pitch of, for example, approximately 406 mm inches between any two horizontally moving mechanisms 23A and 23B. The pitch may be selected to be the height of a carrier plus a clearance distance, for example, 5 mm, between the carrier and the bottom of horizontally moving mechanism 23B, plus the thickness of horizontally moving mechanism 23A, for example, 25 mm.

Furthermore, load port 21 is at an elevation Vshelf of, for example, 1400 mm. Distance Vshelf may be selected to be at a minimum height of the distance of the pitch (e.g. 16 inches) above the shelf of a box opener/loader, because apparatus 20 of this example is designed for use with a box opener/loader. The shelf of a box opener/loader is at an elevation of Vbox (FIG. 6E) of, for example, 900 mm from the floor, and for this reason Vshelf may be selected to be 1300 mm.

In the retracted position, each of three horizontally moving mechanisms 23A–23C has a length of Lretracted (FIG. 5D) of, for example, 285 mm, and this distance is approximately doubled to when extended to the length Lextended of, for example, 770 mm. As illustrated in FIGS. 5E–5F, each of horizontally moving mechanisms 23A–23C has a corresponding number of end effectors 26A–26C, for holding a carrier 27 in the normal manner (e.g. a forked portion of an end effector is slid between the top surface of a carrier 27 and the bottom of a handle 27H on the carrier as illustrated in FIG. 5F). Note that although an end effector is being described and illustrated, any other mechanism for receiving a carrier (also called "carrier receiver") can be used in other embodiments of buffer apparatus 20. Examples of such mechanism include gripper, platform, and "fork-lift" tongs.

After end effector 26A is placed under the handle 27H of carrier 27, end effector 26A cannot be simply withdrawn horizontally if carrier 27 is to be moved. Instead, the horizontally moving mechanism 23A while being horizontally extended is raised by vertically moving mechanism 24 thus nesting carrier handle 21 in end effector 26A and clearing the pins 22A–22C (FIG. 5F) on load port 21. Horizontally moving mechanism 23A is then retracted horizontally, with carrier 27 in tow. Vertically moving mechanism 24 is vertically moved to the lower most position to prepare for further instructions from processing station. At this stage carrier 27 is being held in storage in apparatus 20.

Figures 5G, 5H, 5I:
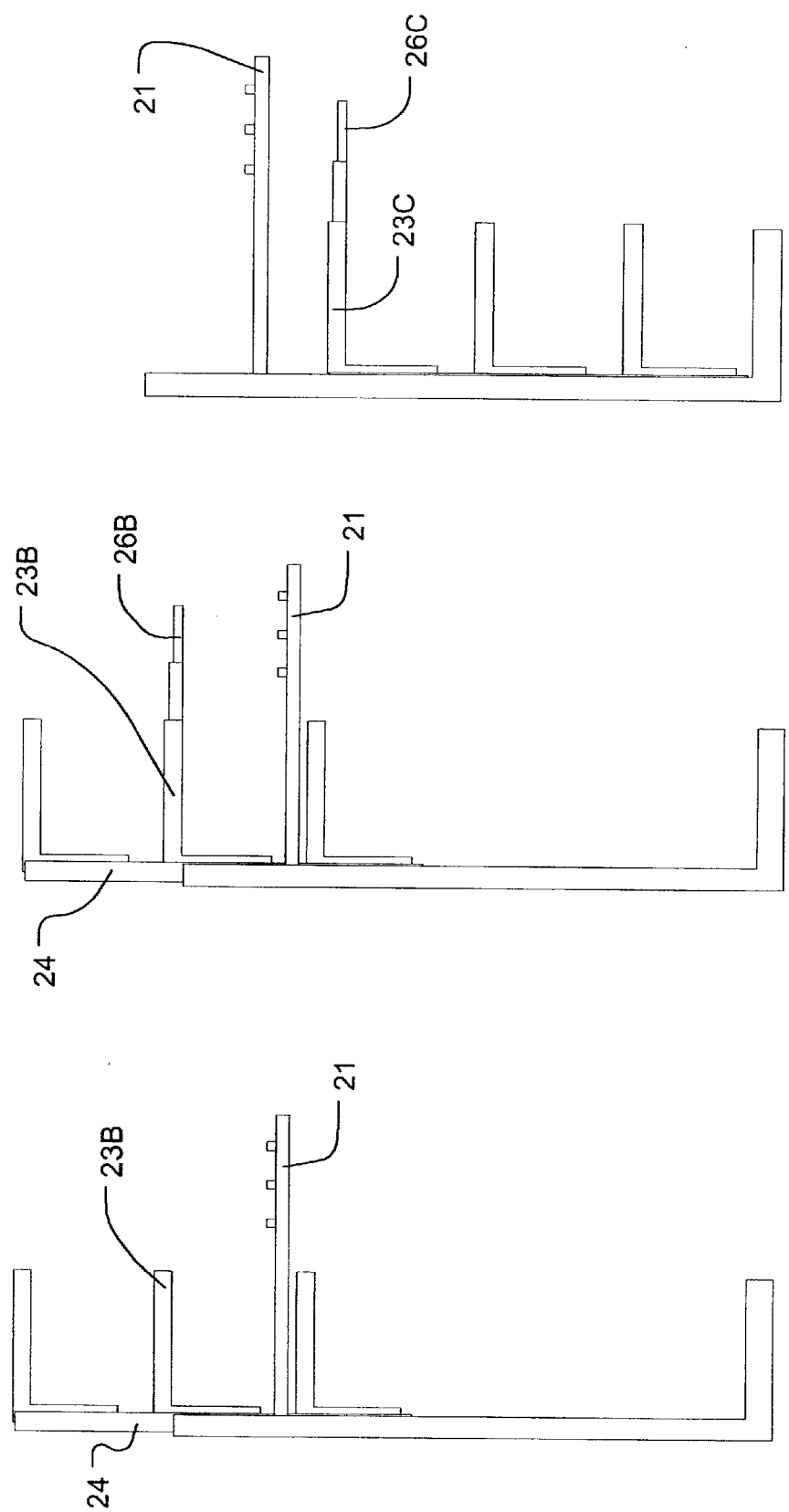

Upon request from a processing system serviced by the buffer apparatus 20, the just-described acts are performed in the reverse order when transferring a carrier to, for example, the lower transfer position (to a shelf of a box opener/loader). Specifically, vertically moving mechanism 24 is raised such that the required, populated horizontally moving mechanism 23A is positioned adjacent to the lower transfer position as illustrated in FIG. 5I. The populated horizontally moving mechanism 23A with a carrier nested in the end effector is extended horizontally to the lower transfer position, while clearing all vertical obstructions such that the carrier (not shown) is positioned over the shelf (also called "load port") of the box opener/loader (not shown). Next, the populated horizontally moving mechanism 23A is lowered by way of the vertically moving mechanism 24 thus depositing the carrier on the load port of the box opener/loader. Then the unpopulated horizontally moving mechanism 23A is horizontally retracted.

Figure 5K:
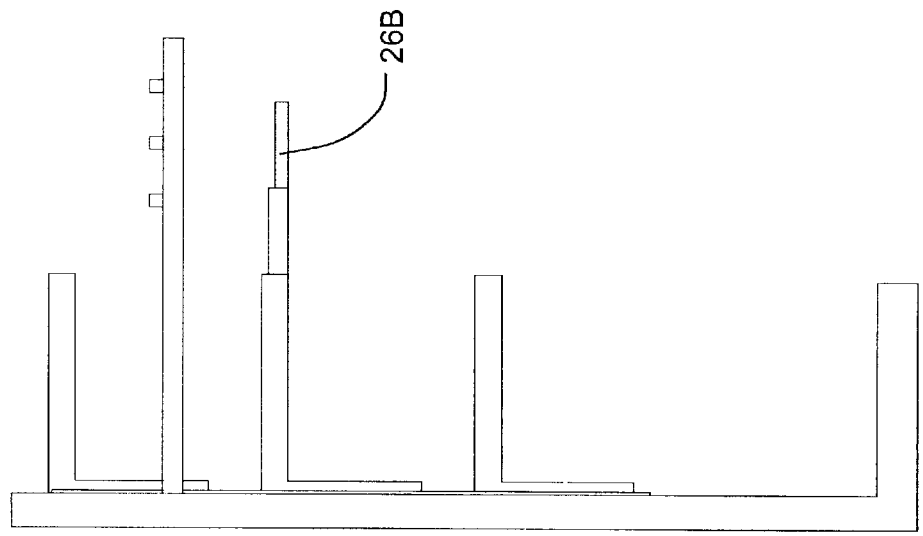
Figure 5J:
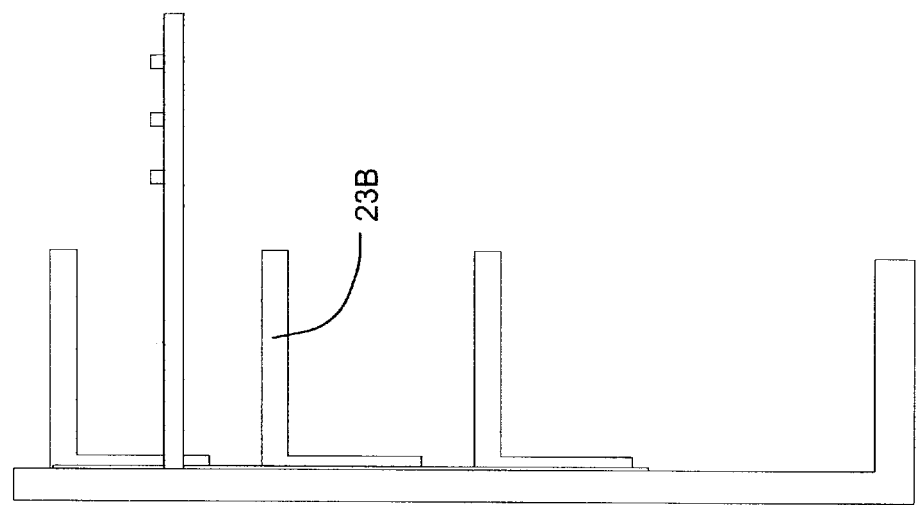
Figure 5L:
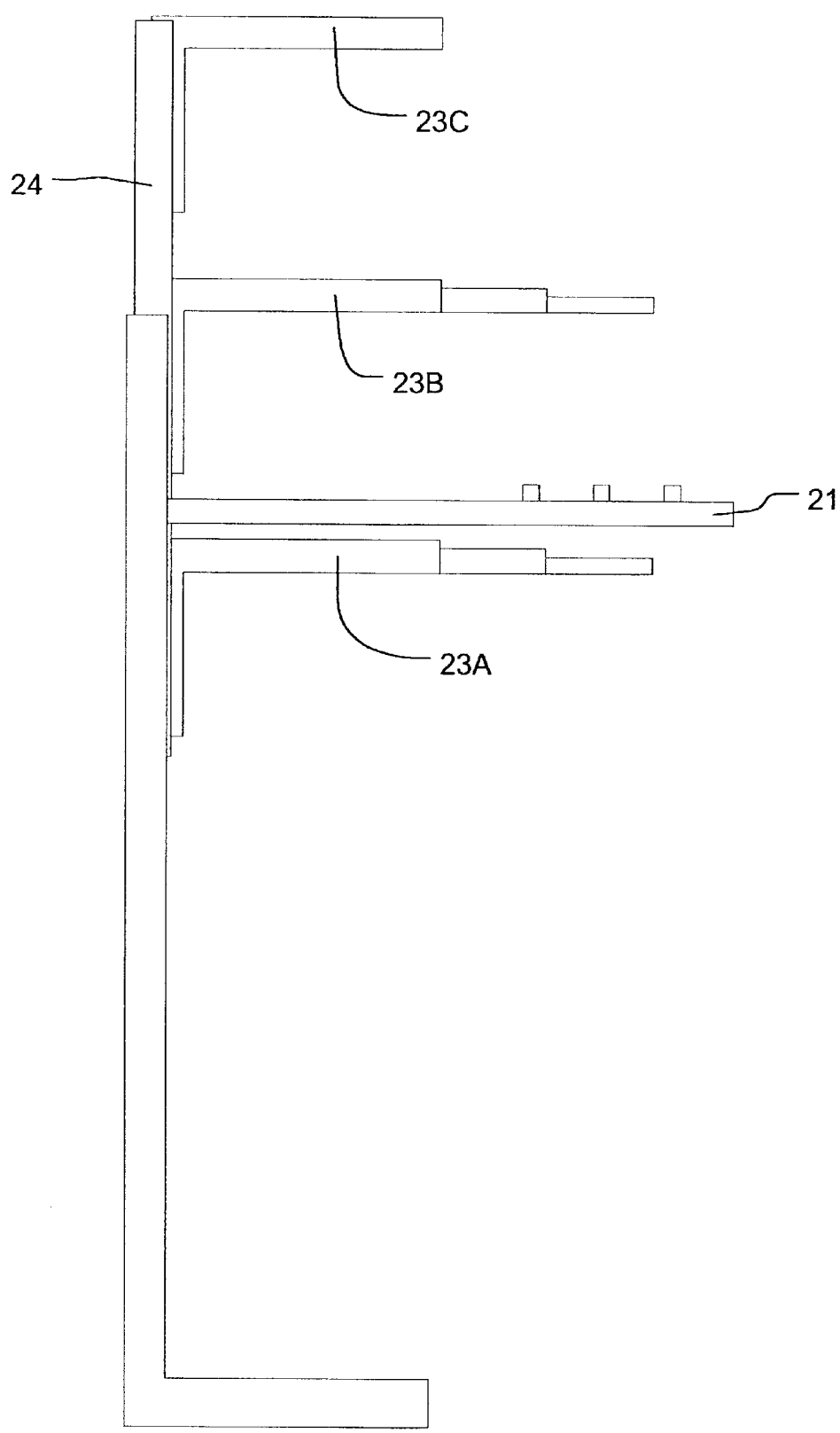

FIGS. 5D–5F illustrate use of an end effector 26A of the lower most horizontally moving mechanism 23A to pick up a carrier 27 from load port 21. FIGS. 5G and 5H illustrate use of an end effector 26B of the middle horizontally moving mechanism 23B to pick up a carrier (not shown) from load port 21. FIG. 5I illustrates use of the upper-most horizontally moving mechanism 23C to pick up a carrier (not shown) from the lower transfer position. FIGS. 5J and 5K illustrate use of an end effector 26B of the middle horizontally moving mechanism 23B to pick up a carrier (not shown) from the lower transfer position. FIG. 5L illustrates use of an end effector 26A of the lower-most horizontally moving mechanism 23A to transfer a carrier (not shown) to/from the lower transfer position.

Buffer apparatus 20 illustrated in FIGS. 5A–5L may include a housing 27 (FIGS. 6A–6D) that partially encloses mechanisms 23A–23C and 24. In the embodiment illustrated in FIGS. 6A–6D, buffer apparatus 20 has been previously loaded with two carriers 27B and 27C, and a third carrier 27A is being loaded. As noted above, lower-most horizontally moving mechanism 23A has been extended sufficiently (e.g. greater than the width of a carrier, Cw), for example, 550 mm. In one specific example illustrated in FIG. 6E, buffer apparatus 20 has a load port 21 at the upper transfer position, while a box opener/loader 28 (with which buffer apparatus 20 is used) has its own shelf 29 at the lower transfer position. Shelf 29 is at an elevation of Vbox, which may be, for example, 900 mm.

Figure 6E:
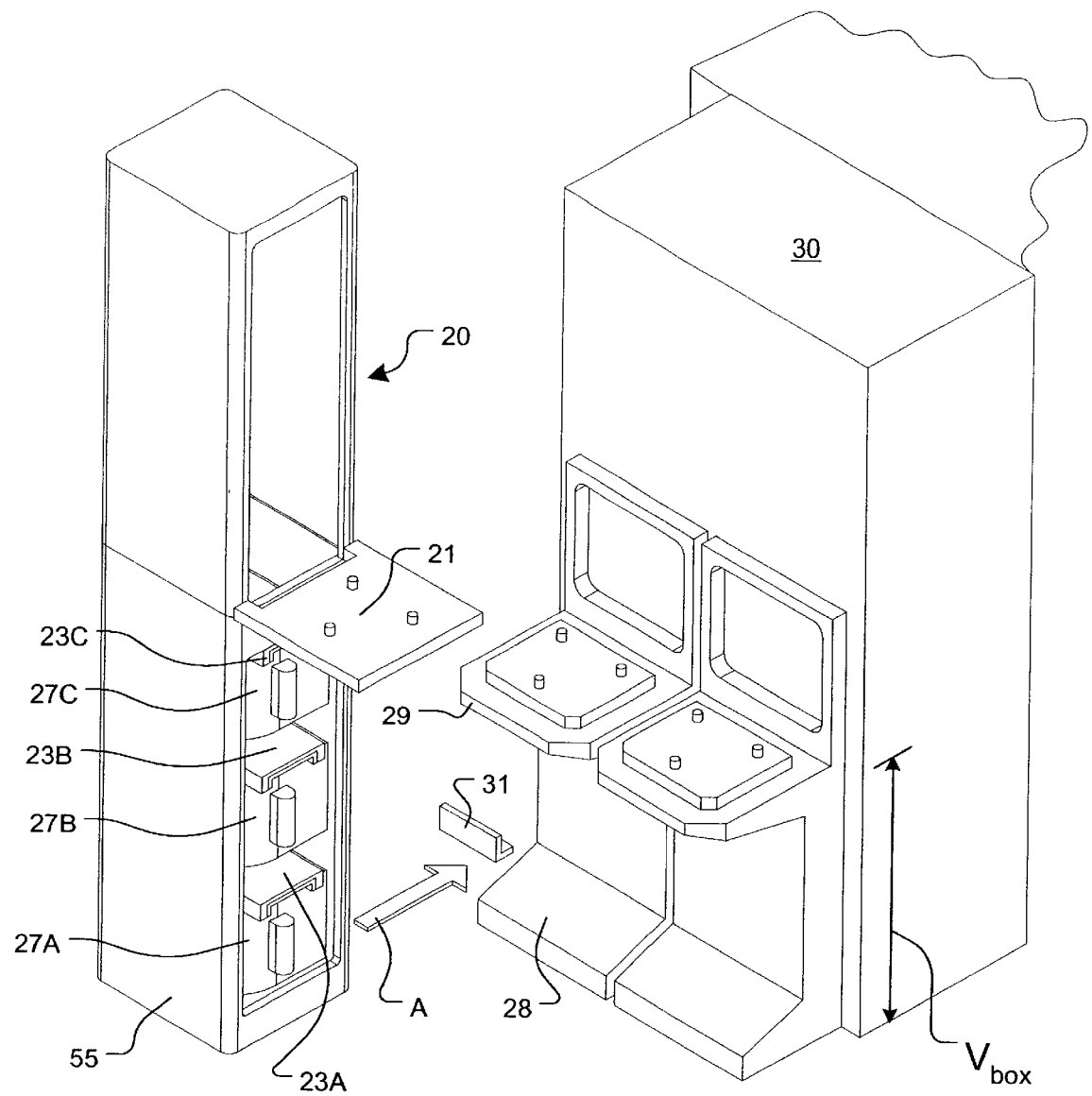
FIG. 6E illustrates, in a perspective view, an initial stage of assembly of the buffer apparatus of FIGS. 6A–6D with a box opener/loader to form a combination (also called "buffer system").

Such a box opener/loader 28 is normally located adjacent to a processing station 30 as shown in FIG. 6E. Buffer apparatus 20 therefore transfers carriers to/from box opener/loader 28 that in turn transfers wafers to/from processing station 30. In such embodiments, buffer apparatus 20 transfers carriers to/from a box opener/loader 28 directly, without an intermediary (such as a human, an OHV, an AGV or a PGV) between the box opener/loader 28 and the buffer apparatus 20.

However, depending on the embodiment, the buffer apparatus 20 may transfer carriers to/from an intermediary, such as a guided vehicle, at the upper and/or lower transfer position. The term "guided vehicle" is used herein to cover any apparatus capable of delivering carriers to a load port of a processing station, either in a human-assisted mode or in a micro-controller, powered mode. In general three types of guided vehicles exist, but are not limited to, personal, rail and automated as depicted in, but not limited to, U.S. Pat. Nos. 5,570,990; 5,967,740; 6,068,104 or as depicted in, but not limited to, SEMI E64-0600, E83-1000 (each of which is incorporated by reference herein in its entirety as background).

The vertical space above load port 21 (after buffer apparatus 20 has been moved (in the direction of arrow A) during assembly) is free of any obstructions and therefore an overhead vehicle (OHV) may bring a carrier from a stocker (such as stocker 1 of FIG. 1) and leave the carrier on load port 21 for storage inside of buffer apparatus 20. In this manner, up to three carriers may be stored in buffer apparatus 20 either by the OHV or by an automated guided vehicle (AGV) or other such intermediary.

Buffer apparatus 20 is used with processing station 30 (FIG. 6E) to ensure that a nearly continuous supply of unprocessed substrates is available for processing, and a processing station serviced by buffer apparatus 20 does not sit idle. During operation, a carrier can be transferred by buffer apparatus 20 to a box opener/loader 28 where substrates are extracted and transferred to the processing station 30. Presence of buffer apparatus 20 does not increase the footprint of the processing station because buffer apparatus 20 occupies an area on the cleanroom floor that is otherwise kept reserved as per the SEMI E15.1-0600 (which is incorporated by reference herein in its entirety as background). On the other hand use of buffer apparatus 20 increase the work in process (WIP) of processing station 30 at the point of use. Additionally, the increased processing station WIP allows for a reduction of intrabay stocker size and need, by moving the storage from the stocker to the front of the processing system.

In another embodiment, the buffer apparatus 20 is movable by means of a motion mechanism such as a caster arrangement (not shown). The mobility of buffer apparatus 20 allows for field replacement or servicing away from the processing station 30. Buffer apparatus 20 can be registered and located by means of a docking mechanism (not shown) that includes a repeatable mount 31 shown in representative fashion in FIG. 6E. The repeatable mount may be similar in nature to the type employed in, but not limited to, U.S. Pat. No. 6,033,175.

In addition, the docking mechanism may include blind attachments for electrical power, electrical signals, and fluid power transfer. Such a docking mechanism allows the buffer apparatus 20 to be precisely and repeatably located adjacent any processing system load port 29 or other desired location; thus the need for the horizontally moving mechanisms 23A–23C to be aligned or "taught" to the processing system load port is negated. The lack of alignment allows the buffer apparatus to be quickly reconfigured, exchanged or field replaced without affecting the operation of the processing system. Field service may be performed while buffer apparatus 20 is docked, from the front, by removing a cover 55 (also called "front cover") of a housing in which the mechanisms are enclosed.

Figure 7B:
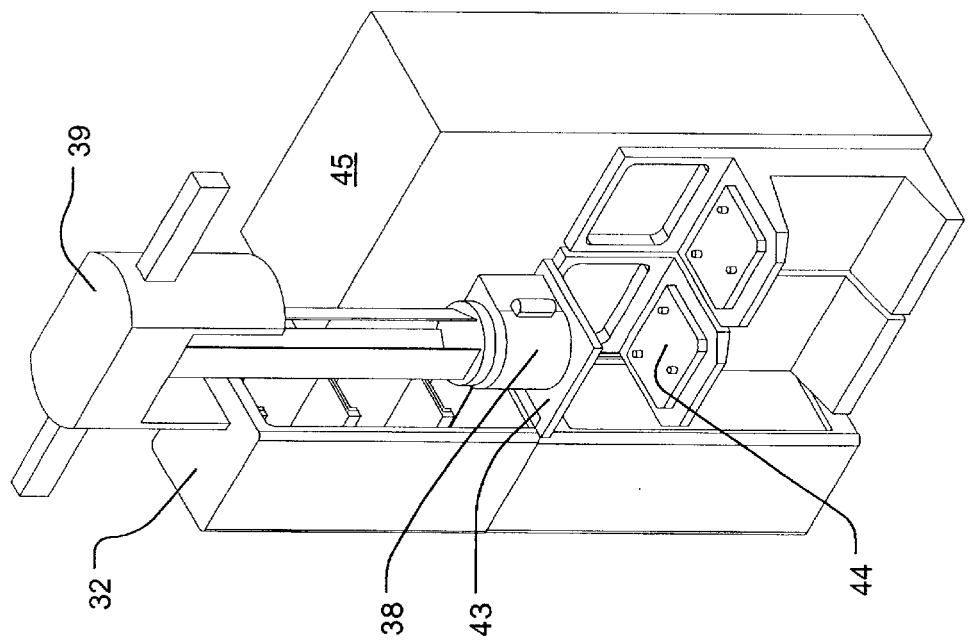
FIGS. 7A–7J illustrate use of the buffer system of FIG. 6E with an overhead vehicle (OHV) to locally store wafer carriers during fabrication of integrated circuit dies.
Figure 7A:
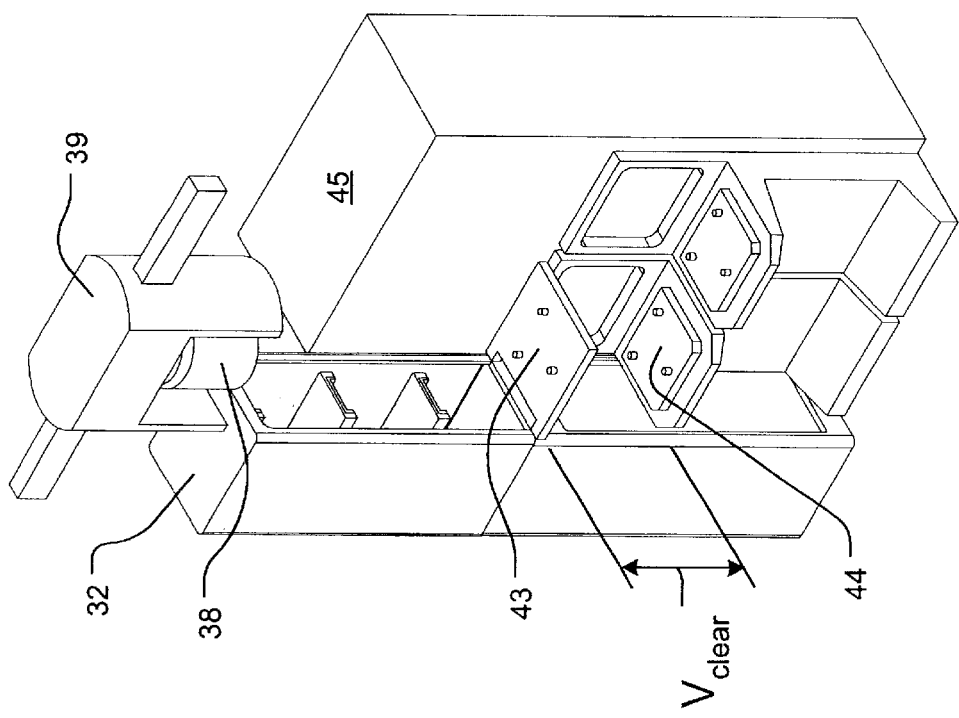
Figure 7D:
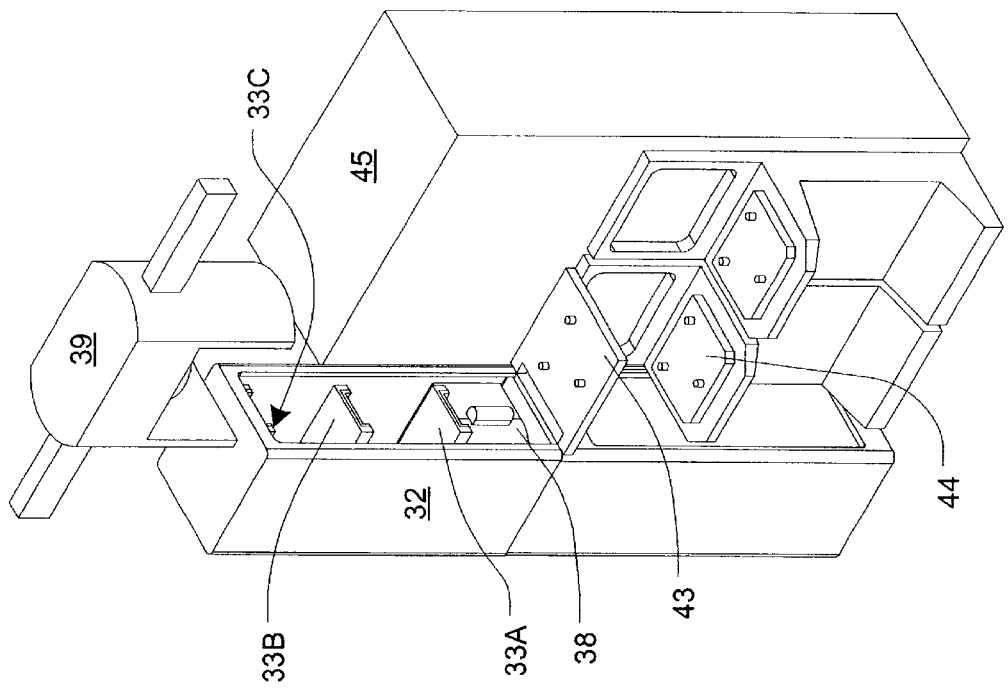
Figure 7C:
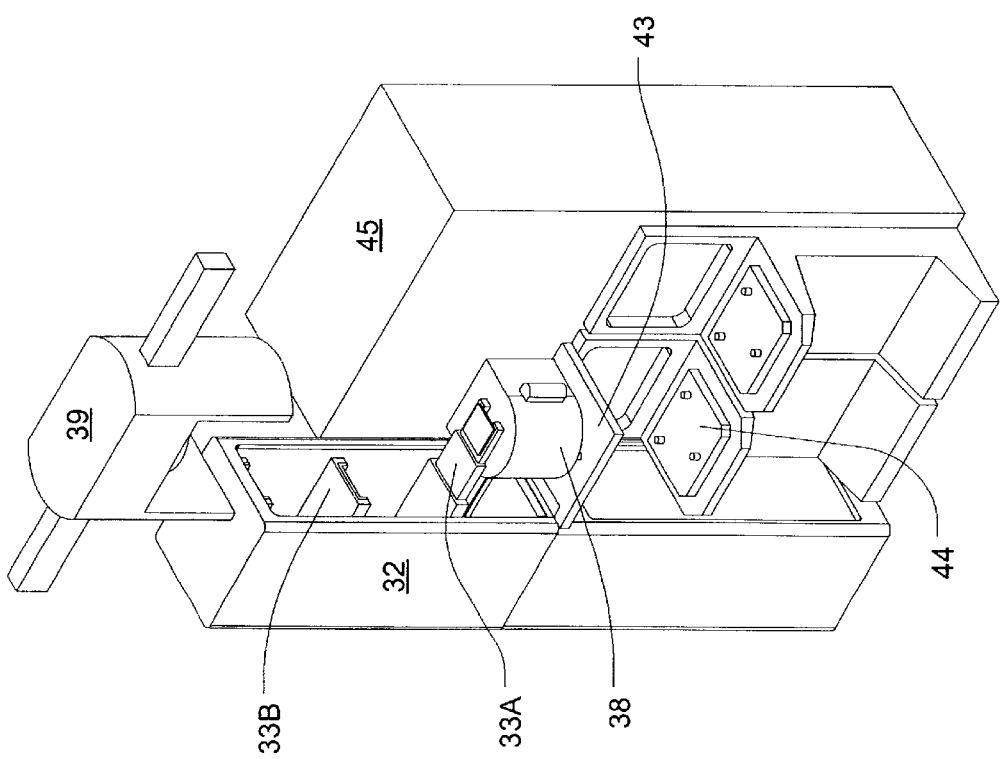

In FIG. 7A, a carrier 38 is transported by an OHV 39 and positioned above load port 43. At this stage, load port 43 is unpopulated (i.e. there is no carrier). Next, as shown in FIG. 7B, the carrier 38 is lowered and deposited onto the unpopulated load port 43 by way of the OHV 39. The OHV 39 is then retracted upward as in FIG. 7C. At the same time buffer apparatus 32 extends a horizontally moving mechanism 33A to pick up carrier 38 from the buffer load port 43 (see FIG. 7D). Note that when buffer apparatus 32 is empty, any of mechanisms 33A–33C can be used. The just-described acts can be repeated up to two times, to store three carriers in buffer apparatus 32.

Figure 7F:
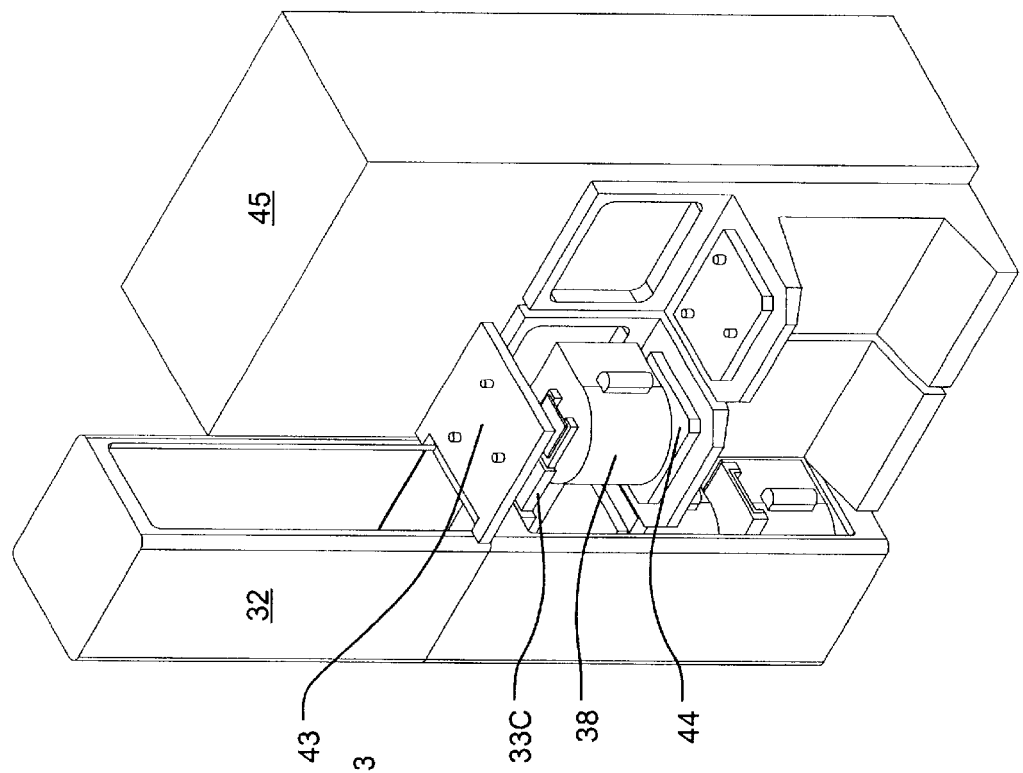
Figure 7E:
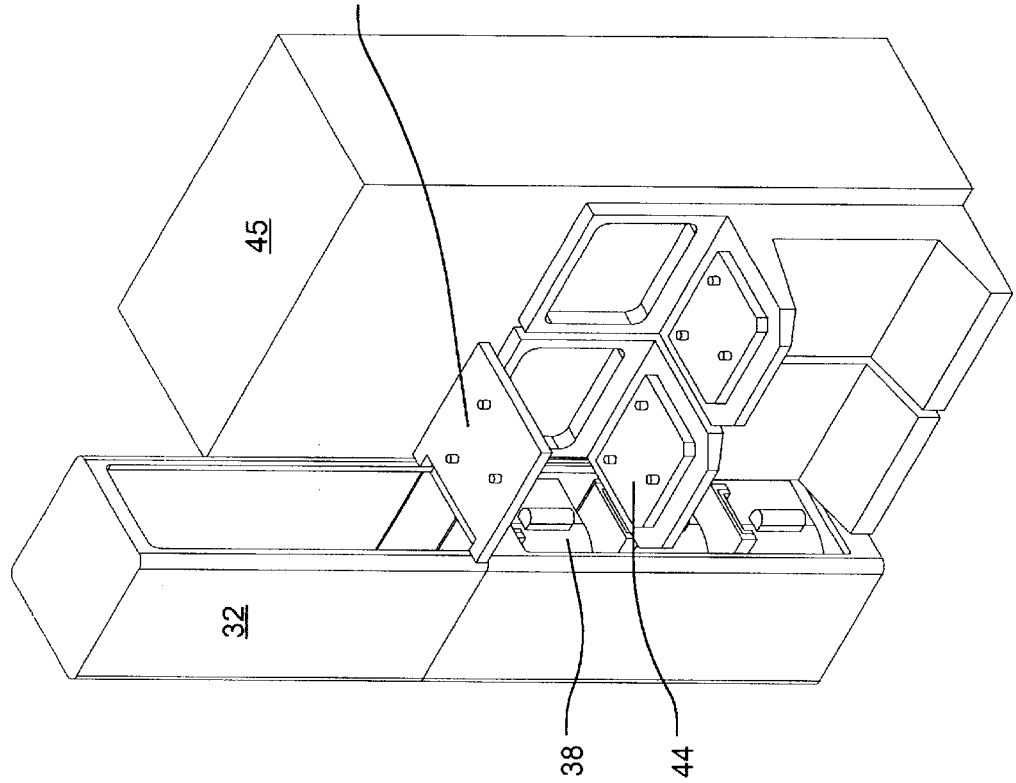
Figure 7J:
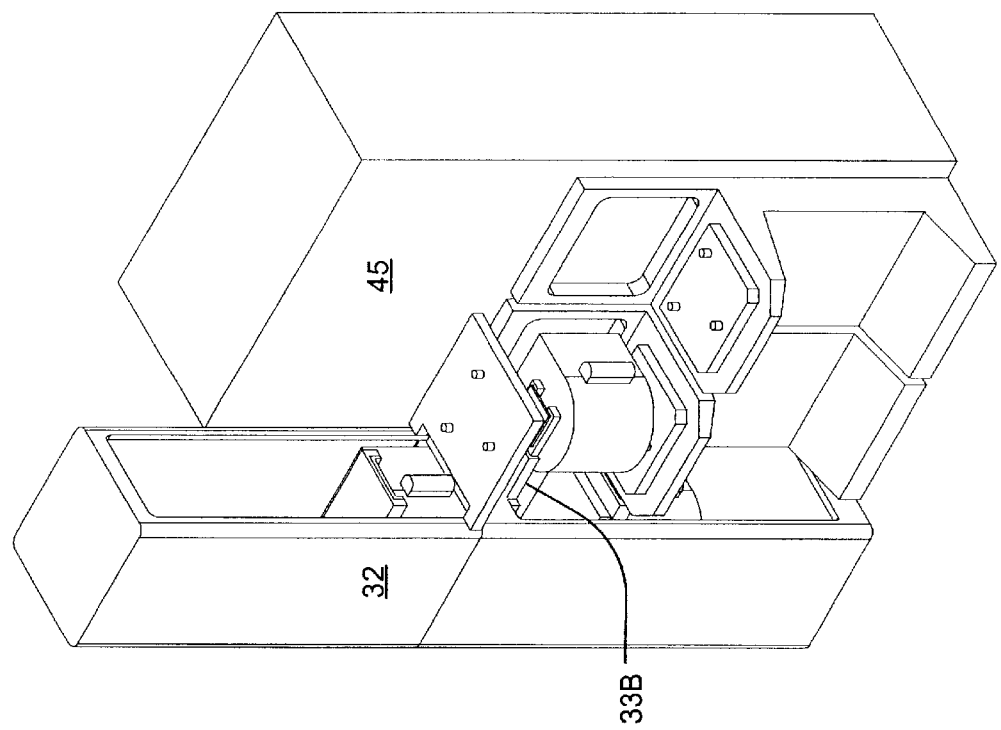
Figure 7G:
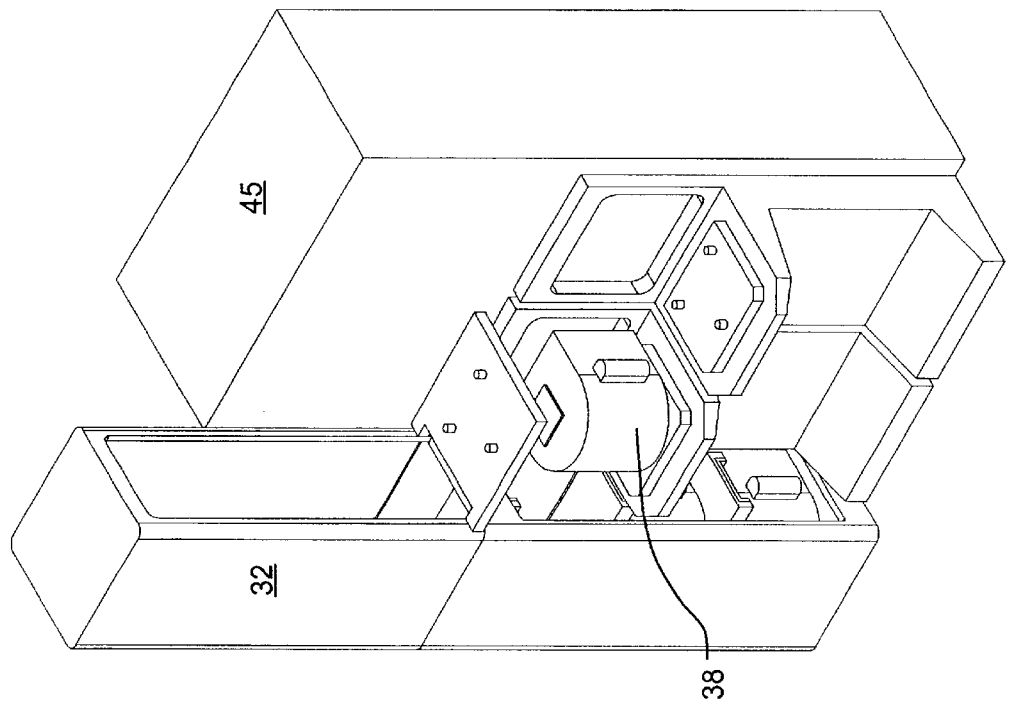
Figure 7:
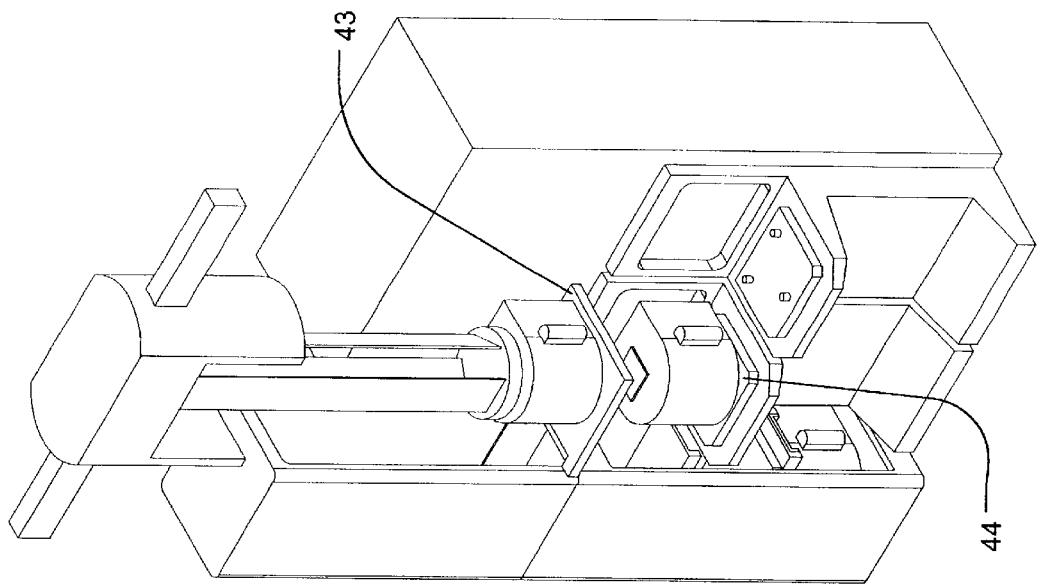
Figure 7:
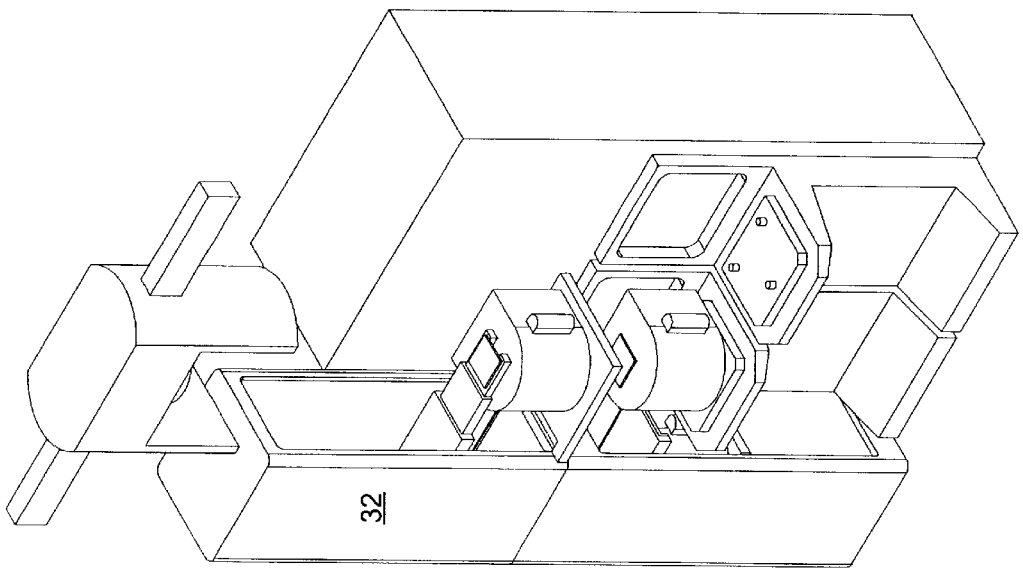

When it is time for processing system 45 to process substrates in a carrier, vertically moving mechanism is moved appropriately, e.g. to place carrier 38 adjacent to the processing system load port 44 (see FIG. 7E) as described previously. Horizontally moving mechanism 33C is then extended (see FIG. 7F) to drop off carrier 38 at processing system load port 44, and thereafter retracted, thereby to leave carrier 38 on load port 44 (FIG. 7G). In the mean time additional carriers may be received at buffer load port 43 (FIG. 7H) and stored in buffer apparatus 32 (FIG. 7I). When a carrier 38 is present at processing system load port 44, one of mechanisms 33A–33C may be kept vacant, so that carrier 38 can be picked up when processing is completed and returned to buffer load port 43 for removal by OHV 39. In the example illustrated in FIG. 7J, horizontally moving mechanism 33B was kept vacant for this reason and is shown being used in this manner.

If one of mechanisms 33A–33C is available, buffer apparatus 32 can be operated to transfer a carrier 38 from buffer load port 43 directly to the processing system load port 44 without holding carrier 38 in storage. Such a transfer without storage is useful when a "hot lot" (i.e. a carrier with substrates that needs to be processed immediately) needs to be processed ahead of any other carriers previously stored in buffer apparatus 32. After substrates, stored in a hot lot carrier 38 are processed by the processing system 45, buffer apparatus 32 reverses its acts, to deposit the carrier 38 back onto unpopulated buffer load port 43 followed by removal by the OHV 39.

Likewise, if only one position within the buffer system is available, meaning 33A–33C are not available and the box opener/loader has a carrier present, the buffer apparatus 32 can "shuffle" or move a "hot lot" to the box opener/loader. "Shuffling" requires moving carriers to temporary locations in order to move the "hot lot" to the box opener/loader.

FIGS. 8A, 8B and 8C show a buffer apparatus 100 in detail, from routine engineering rather than in abstraction. In FIG. 8A, a perspective view is shown of the buffer apparatus 100. A control panel 131 is placed at an ergonomic height in order to manually operate the buffer apparatus 100. In FIG. 8B, a side view of the buffer apparatus 100 is shown with an extended horizontally moving mechanism 117. At the bottom of the buffer apparatus 100, a facilities panel 132, part of the docking mechanism 129, can be seen where the blind connections for electrical power, electrical signals, and fluid power transfer. The facilities panel 132 is attached to the floor via the docking mechanism 129.

FIG. 8C depicts an exploded view of the buffer apparatus 100. A single buffer load port 113 is shown attached to the frame 114 of the buffer apparatus 100. Various pieces of the frame 114 can be seen in the view. The frame 114 is provides structure and support for the buffer apparatus 100, where the sheet metal parts allow for multiple parts to be incorporated into a single part. Sheet metal parts can replaced multiple machined parts that need to be attached to each other via fasteners. A number of horizontally moving mechanisms 117 are attached to part of the vertically moving mechanism 126c and are supported by a structural member 126d. The vertically moving mechanism includes a set of linear bearings 126a, a fixed member 126b, a moving member 126c, a lead screw 127a, a belt/pulley combination 127c (belt not shown), an electric motor 127b fixedly mounted to the frame 114, and a cable track 128.

The set of linear bearings 126a are captured between the fixed member 126b and the moving member 126c within raceways incorporated into the fixed member 126b and the moving member 126c. Interfacing with the bottom of the frame 114, the docking mechanism 129 consists of moving member 129a attached to the frame 114, a fixed member 129b fixedly mounted to the floor, and a moving mechanism 130 consisting of casters or skids used for translation and leveling of the buffer apparatus. The moving member 129a slides into the center of the fixed member 129b in a tab and slot configuration, thus rigidly fixing/clamping the buffer apparatus in place.

In FIGS. 9A–9F, a horizontally moving mechanism 117 is depicted. A guide mechanism 135 in horizontally moving mechanism 117 includes a telescopic mechanism 122 consisting of three stages 120a, 120b and 120c. The first stage 120a incorporates a carrier receiver 120 (e.g. a forked end effector) and a male raceway 135a. The male raceway 135a interacts with one set of linear bearings 135e. The linear bearings 135e slide on an opposing female raceway 135b of member 120b. On the outside of member 120b, a set of male raceways 135c interacts with a second set of linear bearings 135f. The linear bearings 135f slide on a female raceway 135d of member 120c. The lateral drive mechanism 136 of the horizontally moving mechanism 117 includes two independent drive mechanisms 136 and 137, one for each stage of the telescopic mechanism 122.

Member 120a is driven in and out relative to member 120b via the drive mechanism 136. Drive mechanism 136 consists of twin lead screws 136a, a coupling drive belt 136b, an electric motor 136c, three pulleys 136d, and a base plate 136e fixedly mounted to member 120b. The second drive mechanism 137 allows member 120b to drive in and out relative to member 120c. Drive mechanism 137 includes twin lead screws 137a, three coupling drive belts 137b, an electric motor 137c, five pulleys 137d, and a base plate 137e fixedly mounted to member 120c. The twin lead screws 136a and 137b allow for balanced extension forces used to extend and retract the telescopic mechanism 122 without unstable loading of the mechanism.

Although one specific implementation of a buffer apparatus is described above in reference to FIGS. 8A–8C and 9A–9F, other implementations for a buffer apparatus of the type described herein will be apparent to the skilled mechanical engineer, in view of the disclosure. Examples of a vertical guide mechanism that may be used in other implementations include, but are not limited to, an integrated slide and carriage a telescopic slide, or a scissors mechanism. Also, linear bearings (not shown) for a vertical guide mechanism include, but are not limited to, ball bearings, slider bearings, hydrostatic bearings, or roller bearings. Furthermore, a vertical drive mechanism used in a buffer apparatus may include, but is not limited to, a lead screw driven by an electric motor, a pneumatic cylinder, a cable and pulley mechanism driven by an electric motor, a linear servo motor, or a belt driven by an electric motor with the appropriate motion control system.

Similarly, examples of a horizontal guide mechanism may include, but are not limited to, a telescopic mechanism, or a scissors mechanism. The linear bearings for a horizontal guide mechanism include, but not limited to, ball bearings, slider bearings, hydrostatic bearings, or roller bearings. A horizontal drive mechanism may include, but is not limited to, a lead screw, a pneumatic cylinder, a cable and pulley drive, a linear servomotor, or a belt drive with the appropriate control system.

Figure 10A:
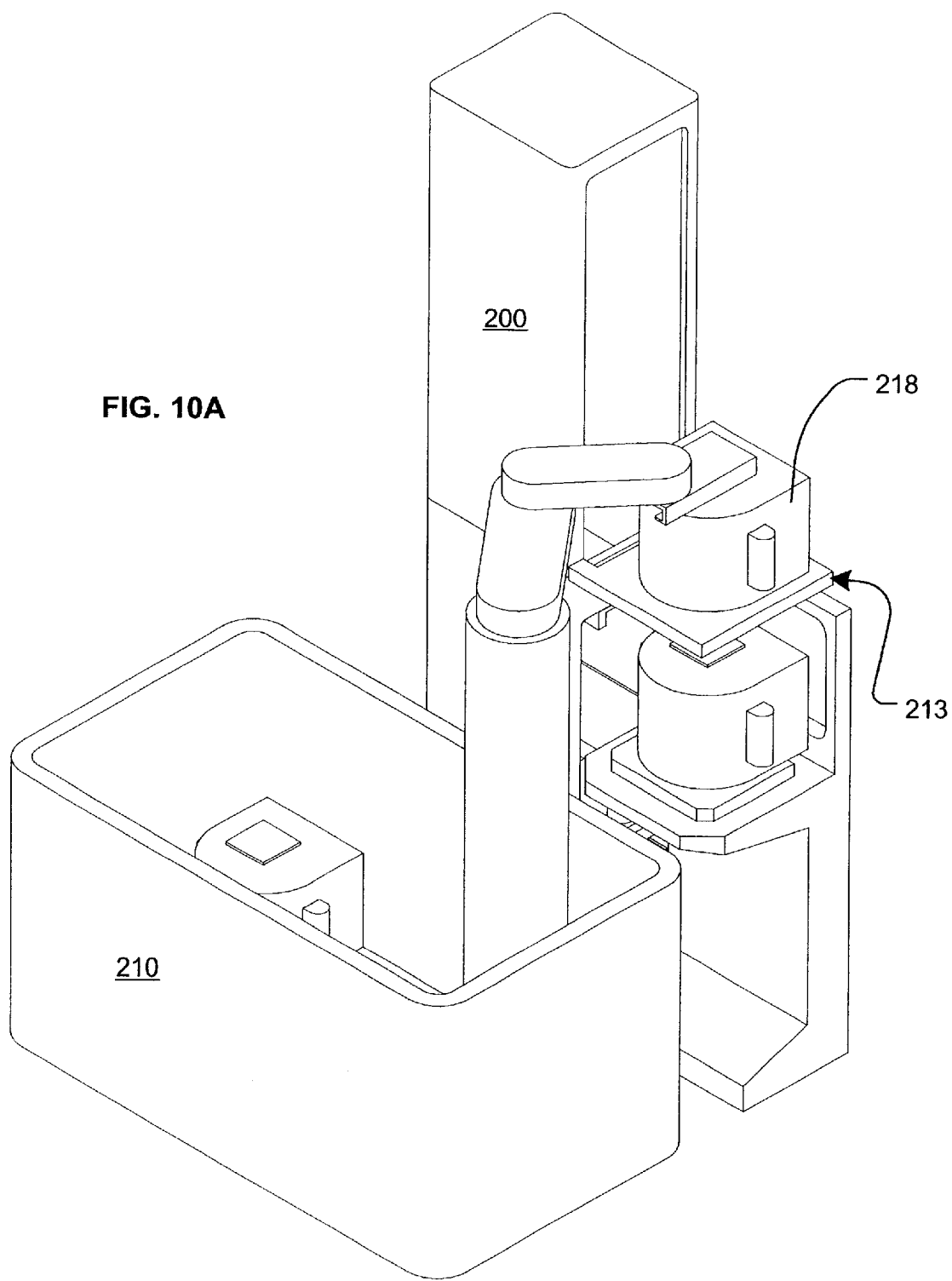
FIGS. 10A–10B illustrate transfer of a carrier between a guided vehicle and a buffer system.

Although buffer apparatus 32 has been described as interacting with OHVs, a buffer apparatus can also interact with guided vehicles. Specifically, a carrier can be deposited by a guided vehicle 210 (FIGS. 10A and 10B) on an unpopulated buffer load port 213 or alternatively on an unpopulated processing system load port 225. Subsequently carriers 218 and 219 can be picked up by and stored in unpopulated horizontally moving mechanisms, waiting to be deposited on an unpopulated processing system load port 225 for immediate processing by a processing station (not shown) serviced by buffer apparatus 200.

Figure 11:
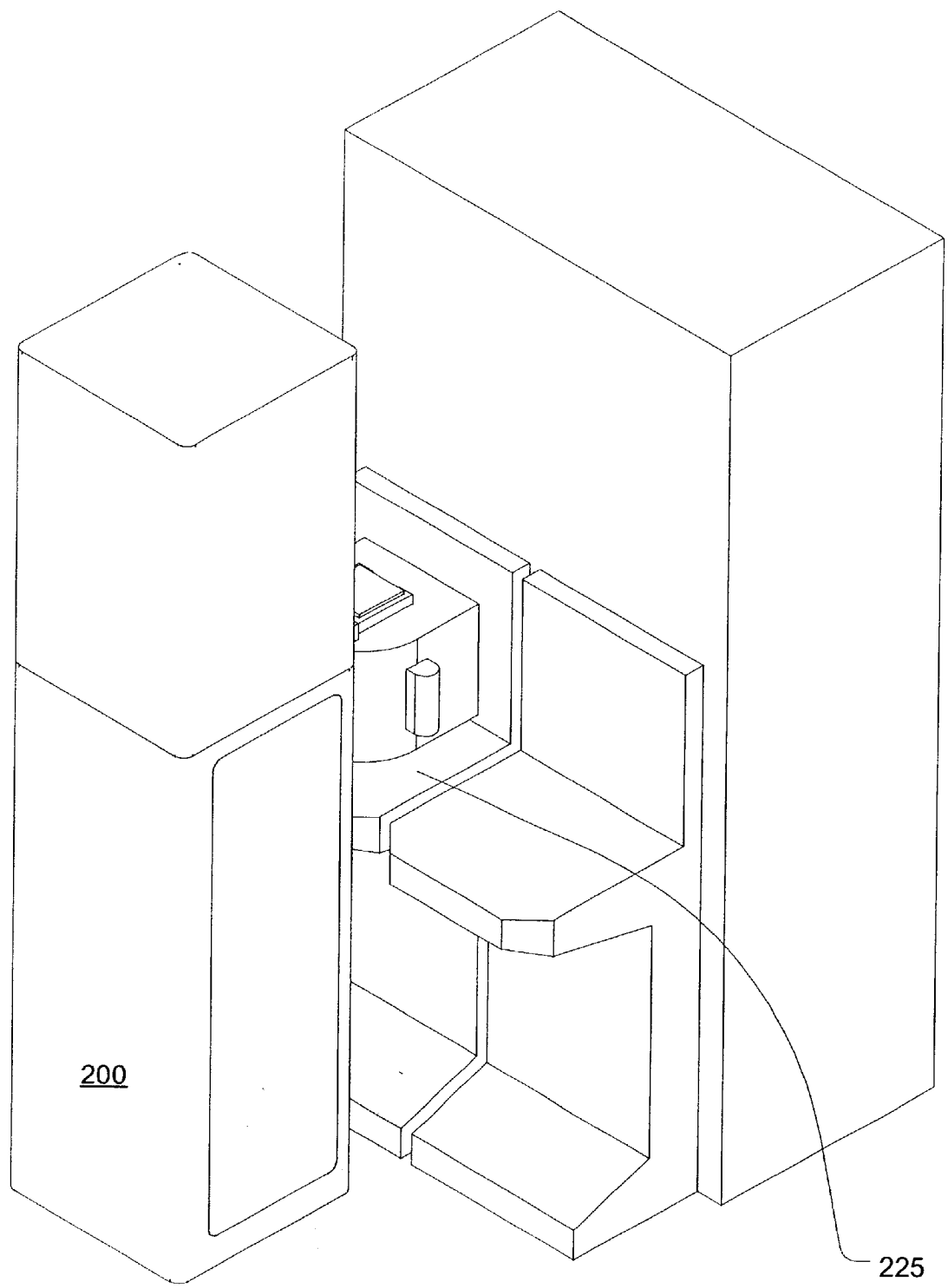
FIG. 11 illustrates placement of a buffer apparatus in front of a box opener/loader, rather than on the side.

As noted above, buffer apparatus 200 has a moving mechanism (e.g. consisting of casters or skids) that allows apparatus 200 to be placed in front of and adjacent to a processing system load port 225 in order to provide a temporary increase WIP, as illustrated in FIG. 11. In an additional embodiment, the buffer apparatus can be moved to another processing system load port (not shown), based on reconfiguration requirements. The reconfiguration requirements may be driven by, for example, a temporary overload in WIP at a processing station, or by a change in the semiconductor fabrication process.

In another aspect of the invention, two or more buffer apparatuses (FIGS. 12A and 12B) are used for storing and transferring carriers to and from load ports of a single processing station. If the processing station has two box opener/loaders adjacent to each other (FIG. 12A) then two buffer apparatuses can be placed on the outer sides of the assembly of processing station and box opener/loaders, with each buffer apparatus being physically adjacent to one box opener/loader. Note, however, that as shown in FIG. 12B, the two box opener/loaders can be separated from one another, and each box opener/loader may have two buffer apparatuses on either side thereof, so that an array of four buffer apparatuses services the processing station. The use of an array of buffer apparatuses for a single processing station ensures that a nearly continuous supply of unprocessed substrates is available for processing and the processing station does not sit idle. Such an array of buffer apparatuses allows for servicing or field replacement of an individual buffer apparatus, while the remaining buffer apparatuses provide carriers to the processing station, eliminating system down time.

Figure 12A:
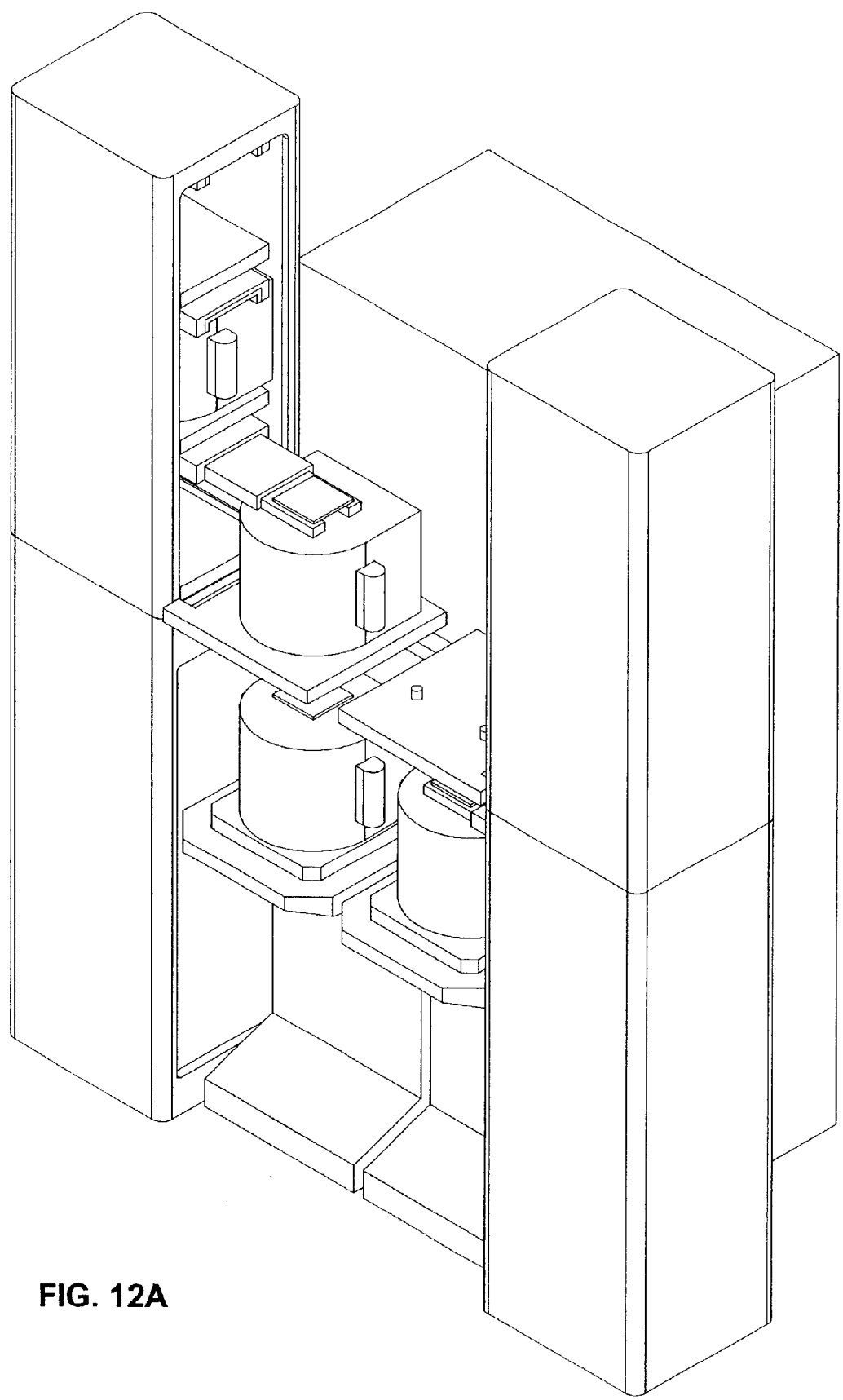
FIGS. 12A–12C depict arrayed buffer systems.
Figure 12B:
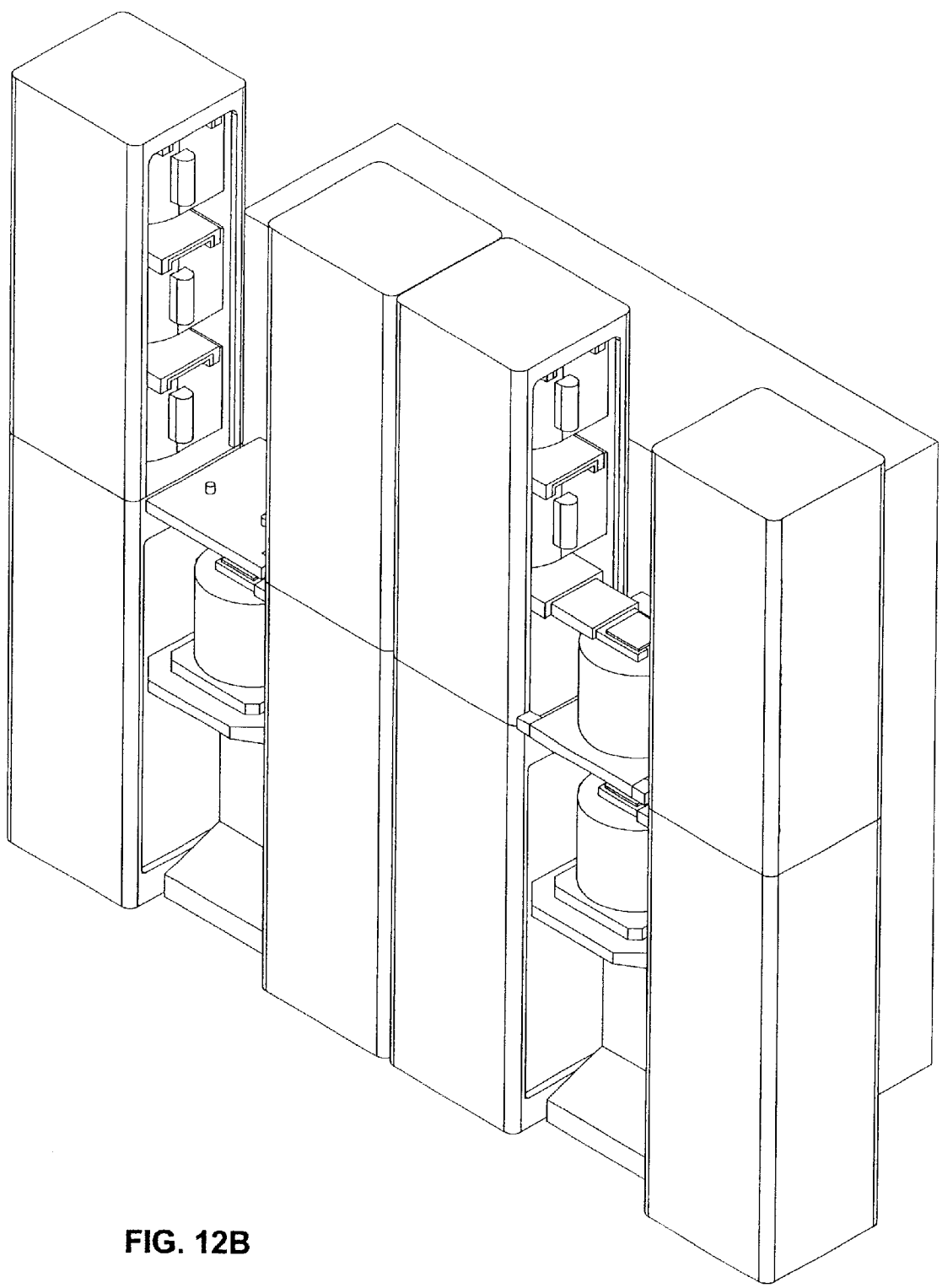
Figure 12C:
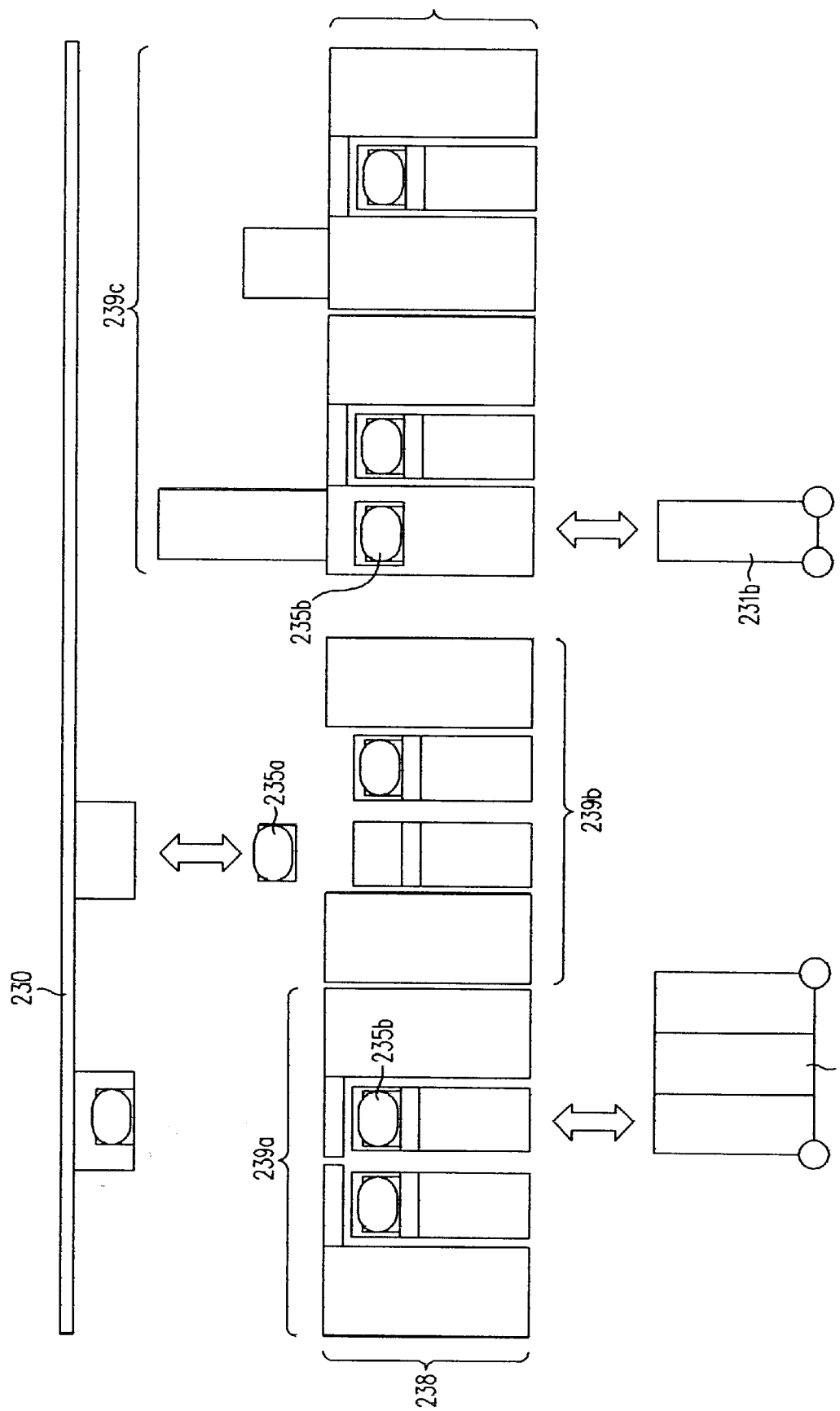

In FIG. 12C a combination of arrayed buffer systems 238 is the item depicted schematically, comprising arrayed buffer systems 239a–239c, OHV system 230 and guided vehicles 231a–231b. The schematic representation depicts the hierarchy and relationships of each component with respect to the depicted item. Various interactions occur between the combination of arrayed buffer systems 238 and the OHV system 230 and guided vehicles 231a–231b. A vertical arrow indicates the interaction between the OHV system 230 and the arrayed buffer system 239b where a carrier 235a is transferred to and from the OHV system 230 and the arrayed processing system 239b. Two vertical arrows indicate the interaction between guided vehicle 231a–231b and the arrayed buffer systems 239a and 239c where carriers 235b are transferred to and from arrayed processing systems 239a and 239c and guided vehicles 231a–231b.

Figure 13A:
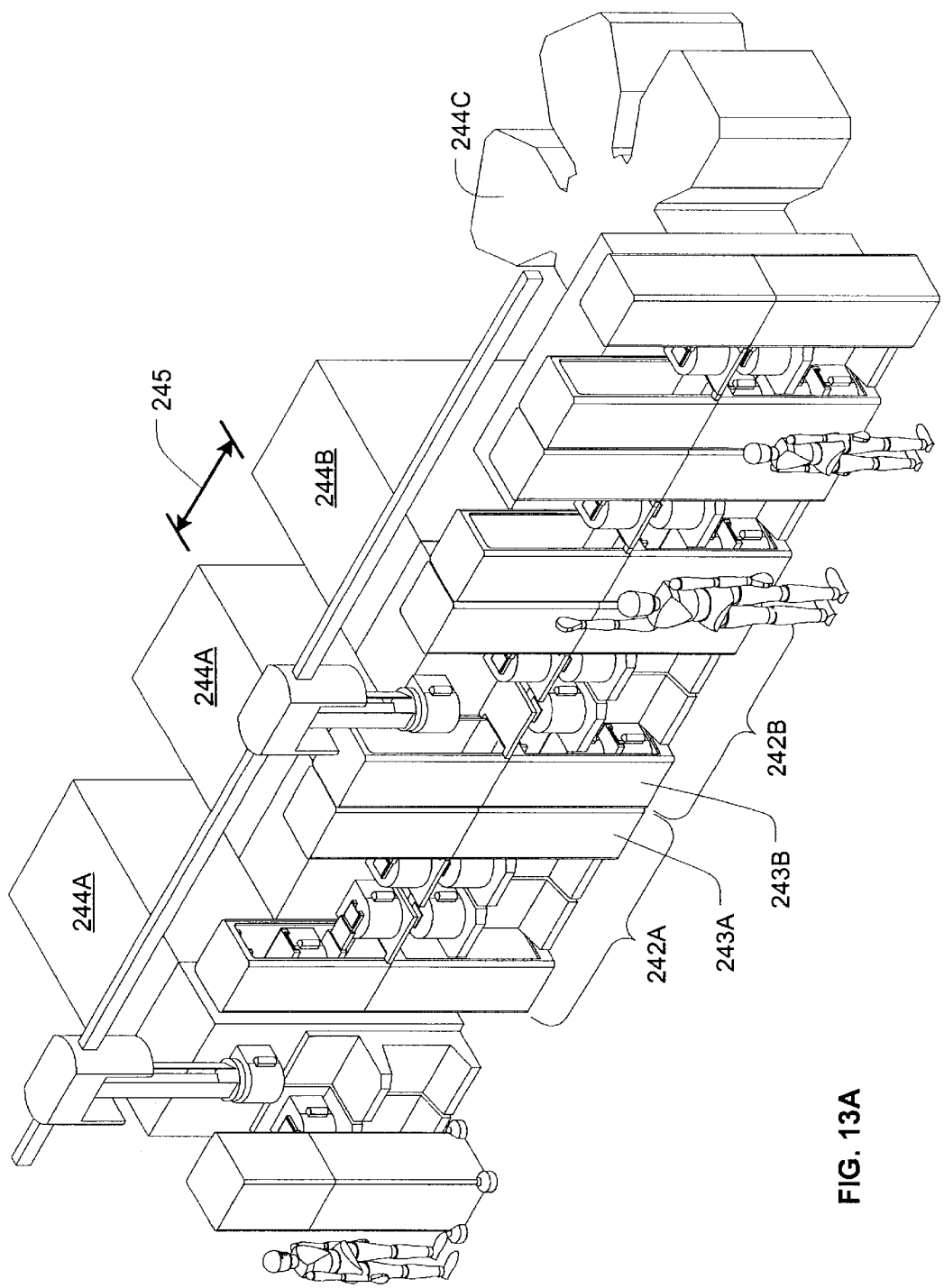
FIG. 13A depicts arrayed buffer systems in a dense packed arrangement and the interaction of the buffer systems with OHVs, guided vehicles, and operators.
Figure 13B:
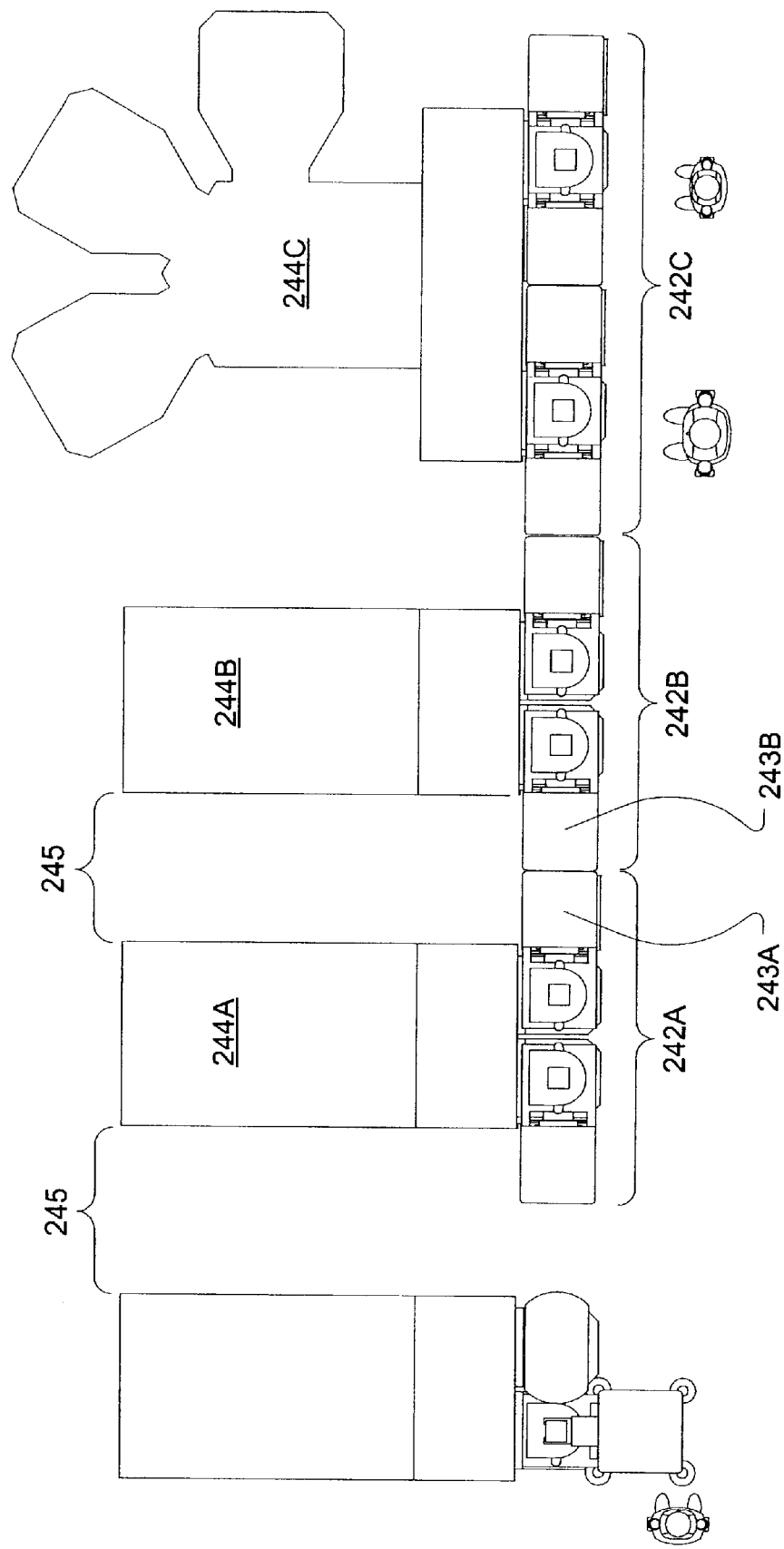
FIG. 13B depicts dense packing of processing stations and the maintenance width derived from the use of buffer systems.

Additionally as illustrated in FIGS. 13A and 13B, arrayed buffer systems 242a–242c can be "dense packed" as described in the following: SEMATECH "I300I Factory Guidelines: Version 5.0" (which is incorporated by reference herein in its entirety as background). See section 2.12 and 7.12; Intel Corporation "Factory Considerations for High Volume Manufacturing Using 300 mm Wafer," STS97, Gargini and Pillai, (which is incorporated by reference herein in its entirety as background). See page 60 of STS97.

Dense packing allows for the EFEMs of adjacent processing systems 244a–244c to be placed one maintenance width 245 apart while placing the buffer apparatus 243a and 243b of two adjacent arrayed buffer systems 242a and 242b directly next to each other without being separated by maintenance width 245. In the United States, the maintenance width is dictated to be three feet by OSHA. In other countries, the maintenance width may be one meter. A maintenance width is not required by a buffer apparatus due to the ability to be serviced from the front of the buffer apparatus.

Figure 13C:
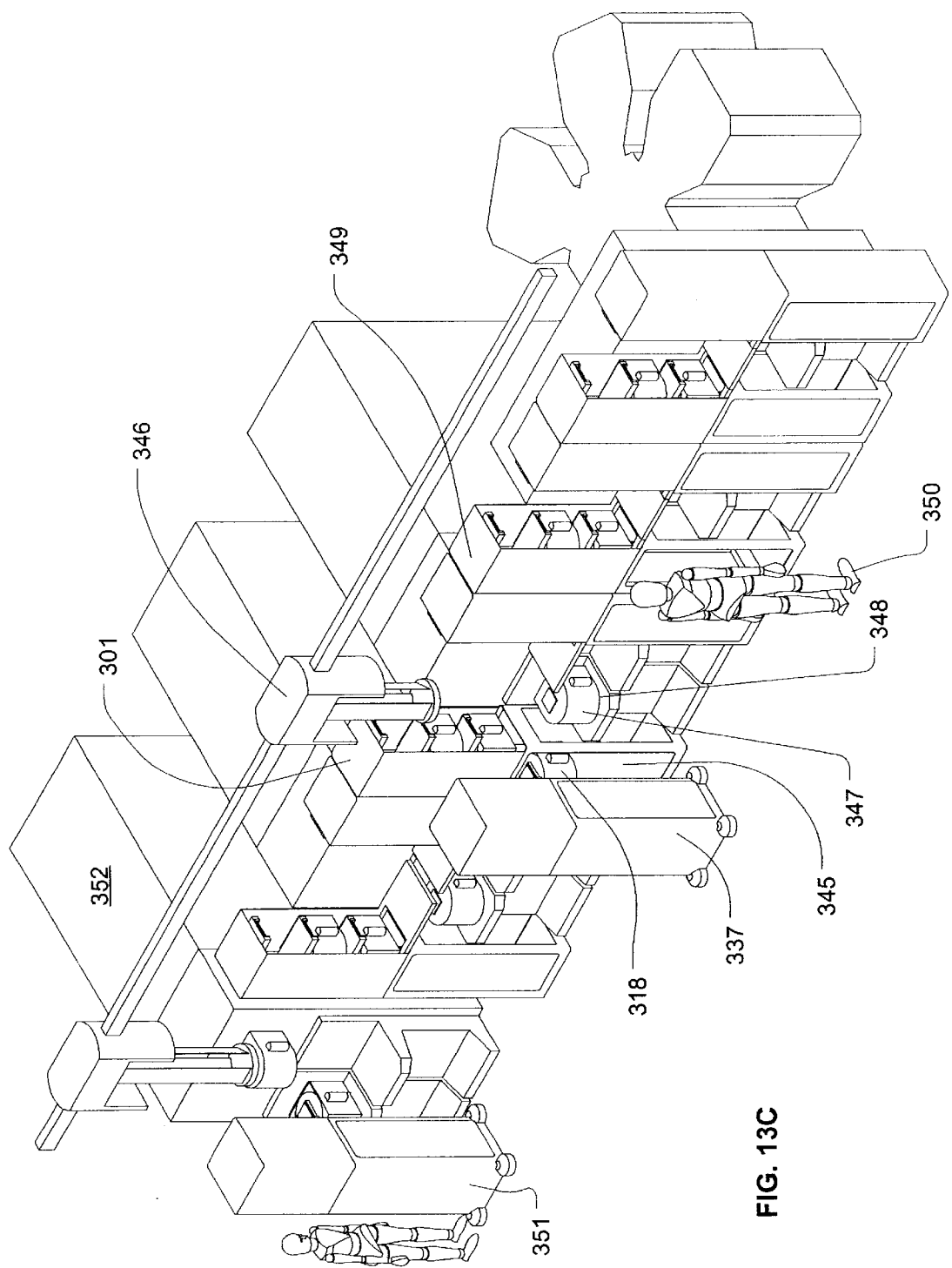
FIG. 13C depicts arrayed buffer systems in a dense packed arrangement and the interaction of the buffer systems with OHVs, guided vehicles, and operators.

FIG. 13C depicts a guided vehicle and/or a movable buffer apparatus 337, both without a buffer load port, transferring a carrier 318 directly into a buffer apparatus without buffer load port 301.

FIG. 13C also depicts a buffer apparatus 345 where a buffer load port has been removed (or alternatively retracted horizontally into apparatus 345, or folded into a vertical position) to allow OHV 346 to directly transfer a carrier 347 to the processing system load port 348. Direct placement of carriers onto the box opener allows for hot lots to bypass the buffer apparatus. If the buffer load port is removed, the buffer apparatus is utilized in a manner identical to a magazine feed apparatus, for example, an automatic nail gun or a paper stapler.

FIG. 13C further depicts a buffer apparatus 349 where an operator 350 has accessed the buffer apparatus 349 to perform periodic maintenance or service to the buffer apparatus 349; FIG. 13C also depicts a movable buffer apparatus 351 used to increase the WIP of a processing system 352 that is not equipped with an arrayed buffer system.

As would be apparent to the skilled artisan in view of this disclosure, a number of modifications and adaptations may be made to a buffer apparatus of the type described herein. For example, the buffer apparatus may be provided with wheels, and may be guided during travel on the floor of a cleanroom by one or more rails. Moreover, two or more buffer apparatuses may be attached to one another to provide increased storage capacity. Also, in other embodiments a buffer apparatus may be physically attached to a box opener/loader, to form a combination apparatus that stores as well as opens carriers.

Additionally, one aspect of the invention reduces the footprint of the environmental front-end mechanism (EFEM) 270a and 270b resulting in decreased EFEM complexity by removal of the EFEM robot track. The resulting footprint savings is 50%. In another aspect of the invention, dense packing is achieved by placing a number of buffer apparatuses adjacent to each other, and EFEMs that share a common maintenance corridor/width. The utilization of dense packing allows for a reduction in cleanroom footprint.

Figure 1B:
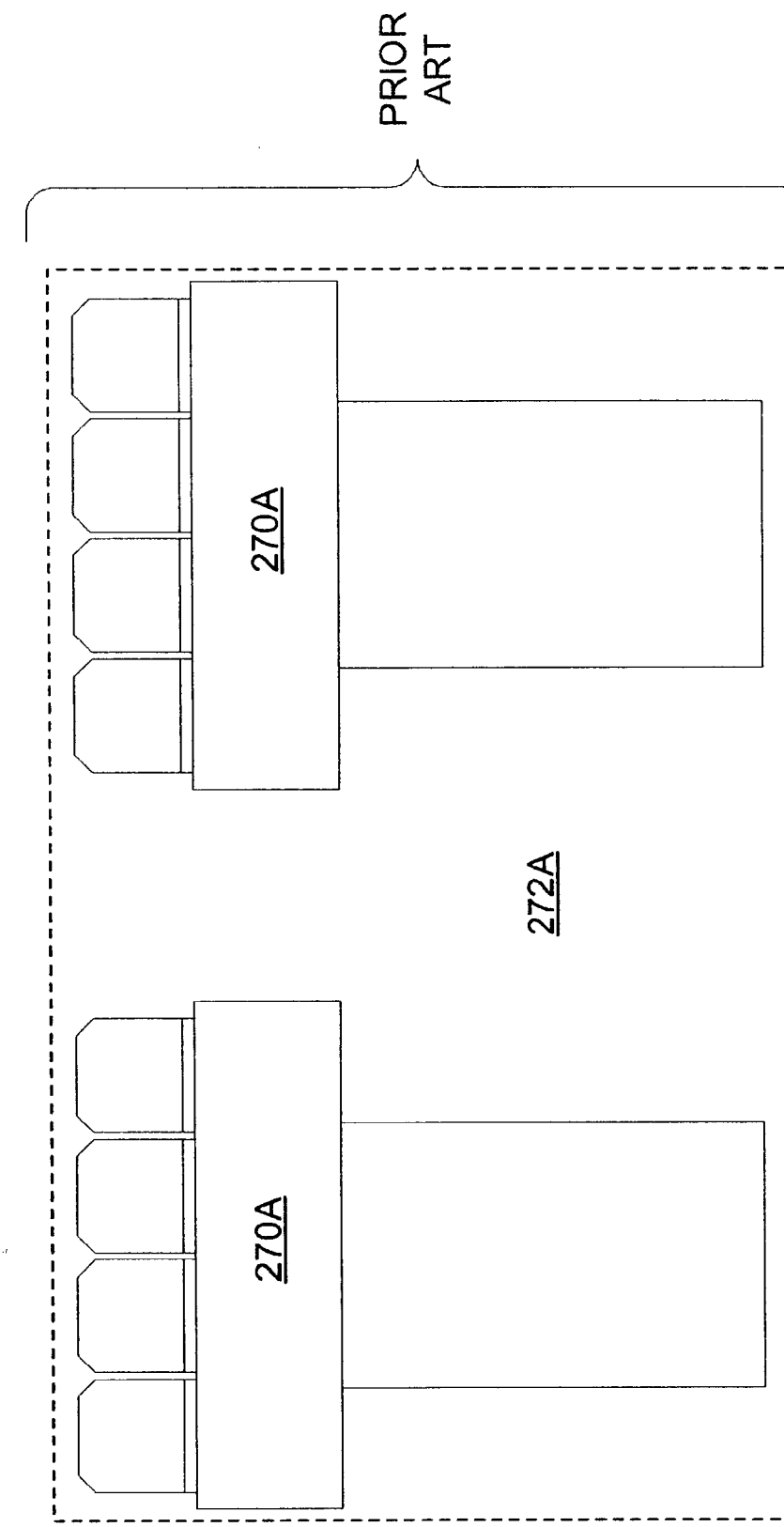
FIG. 1b depicts a view of two fabrication systems of the prior art arranged lateral to each other.

The footprint reduction between area 272a used in the prior art configuration as shown in FIG. 1B, and area 272b used in accordance with the invention as shown in FIG. 13B results in a savings of 25%.

Figure 14:
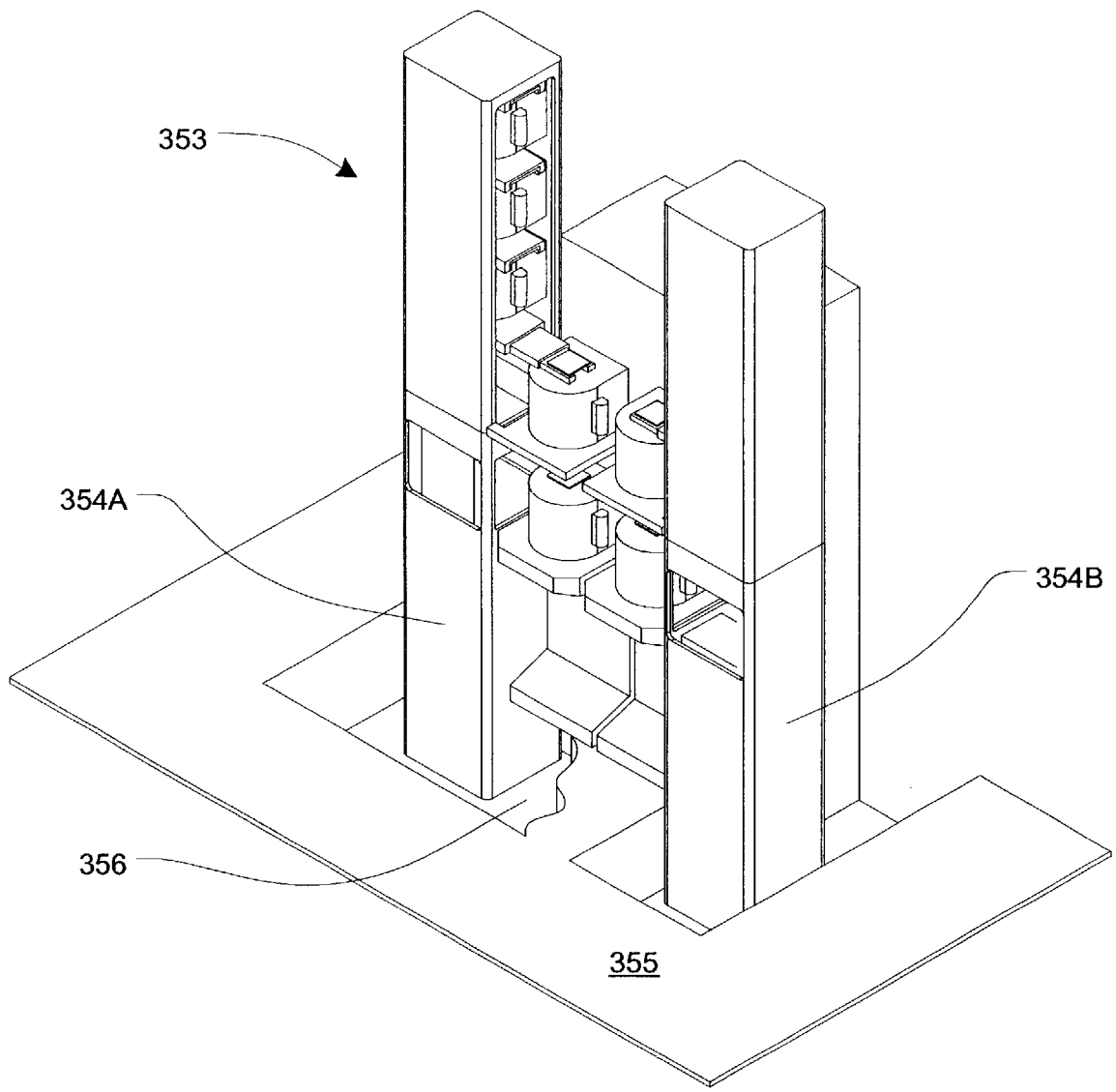
FIG. 14 depicts an arrayed buffer system with extended buffer apparatus.

FIG. 14 depicts an extended, arrayed buffer system 353 where the buffer apparatus 354a–354b extends below the floor 355 through a hole 356. The hole 356 is shown larger than necessary for clarity.

Figure 10B:
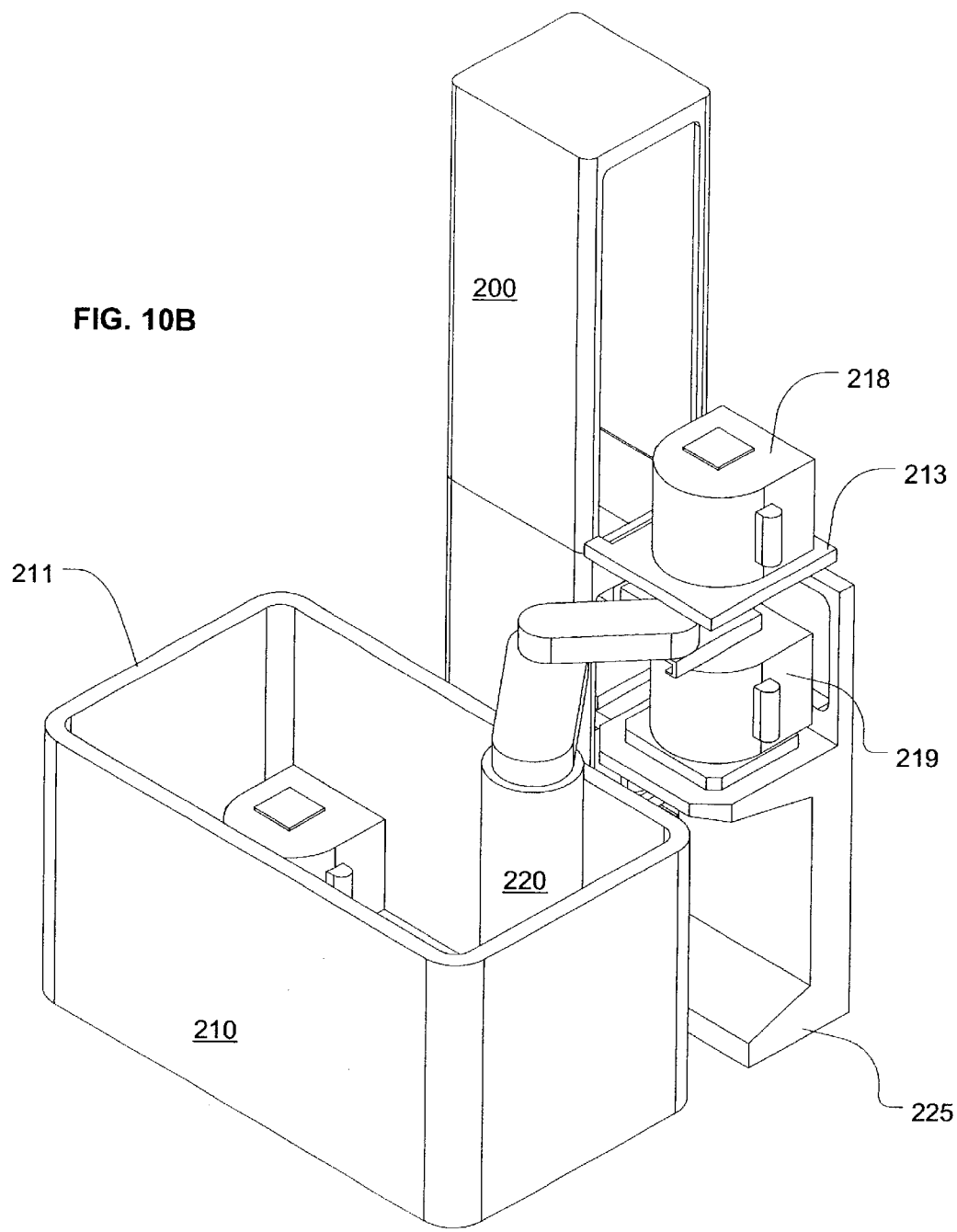
Figure 15A:
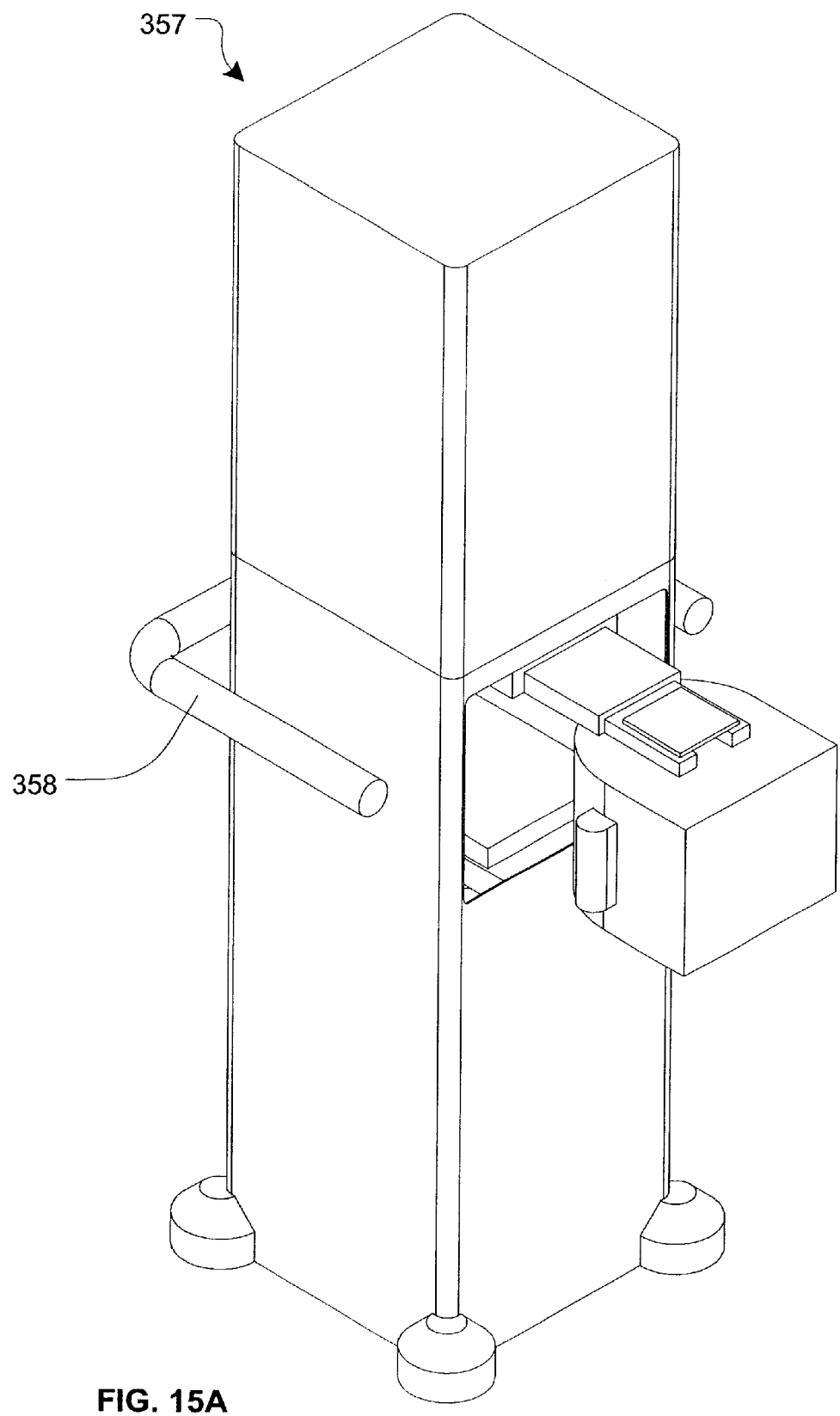
FIGS. 15A–15C depict use of a buffer apparatus in a personal guided vehicle, a rail guided vehicle, and an autonomously guided vehicle respectively.
Figure 15B:
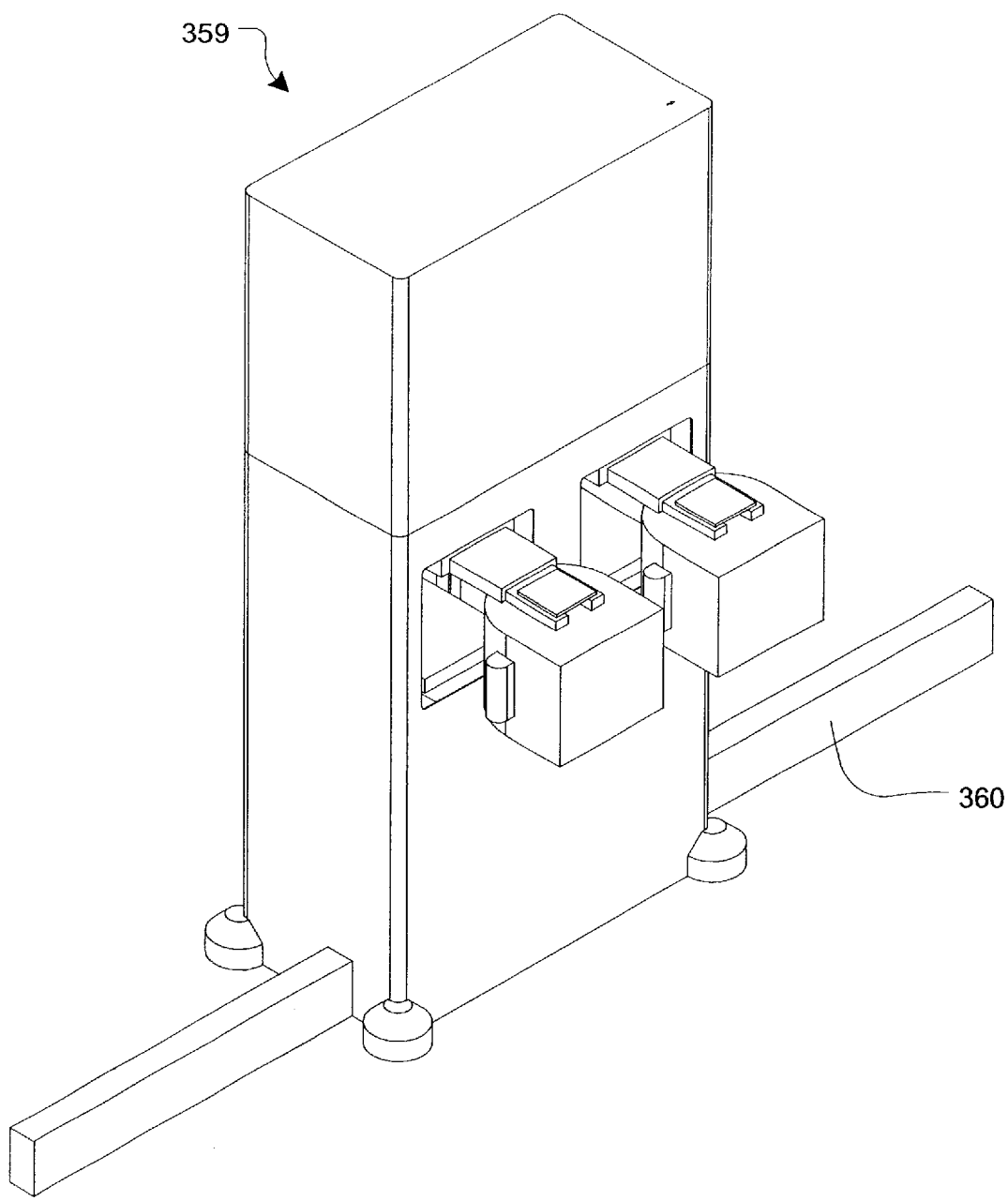
Figure 15C:
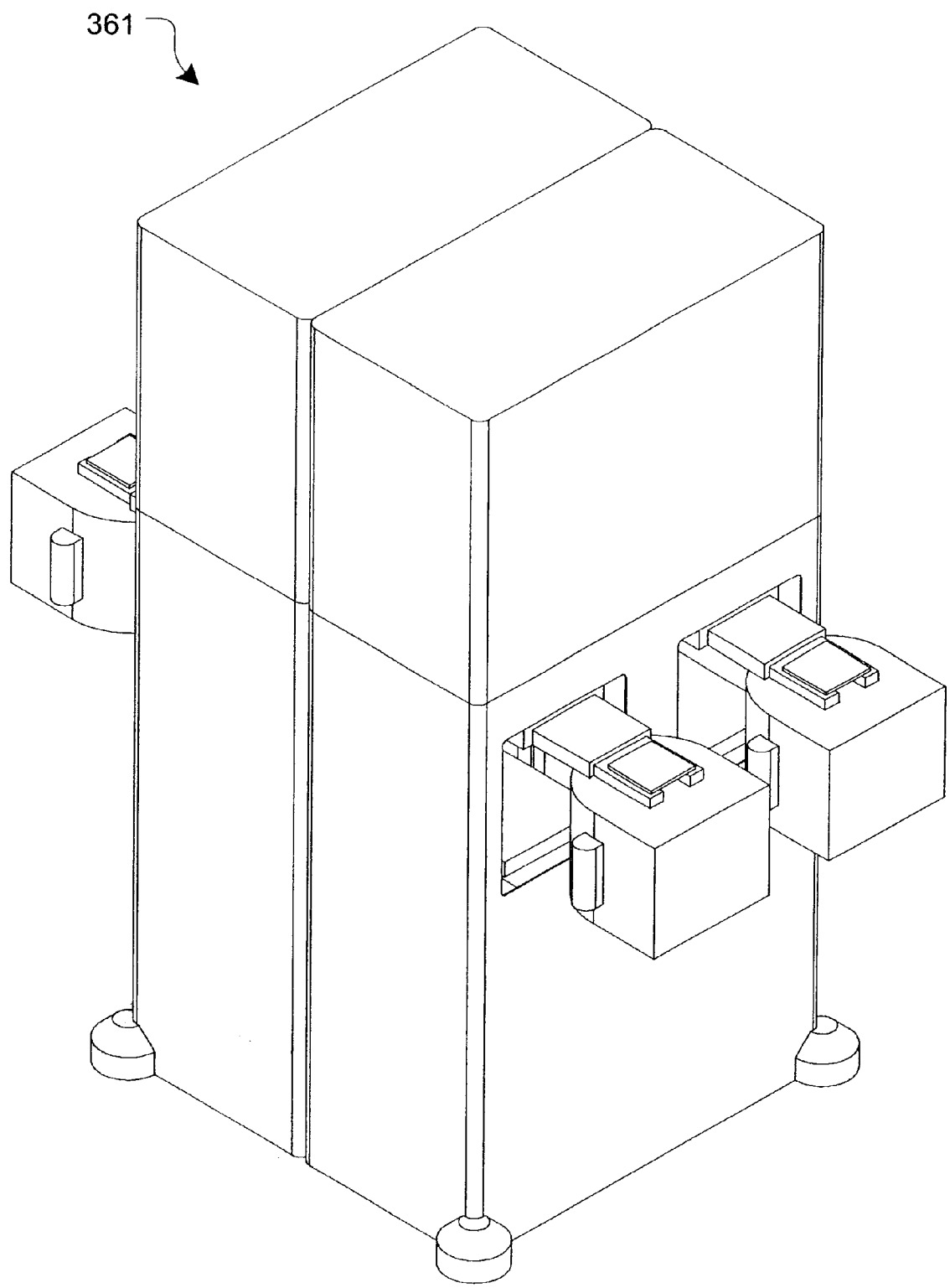

As in FIGS. 15A–15C, one or more buffer apparatus can be used with additional features and/or subtraction of features as a guided vehicle such as a PGV 357 or RGV 359 or AGV 361. Specifically, a robot arm 220 (FIG. 10B) may be removed from vehicle 210, and the above-described shelf may be removed from a buffer apparatus. Thereafter, a number of buffer apparatuses (e.g. four) are placed within a volume defined by wall 211 (FIG. 10B). Therefore, a buffer apparatus replaces an automated robotic arm 220 that is otherwise required by existing guided vehicles, as described in but not limited to, U.S. Pat. No. 5,570,990 that is incorporated by reference herein in its entirety. Use of a buffer apparatus, as a part of a guided vehicle, results in increased guided vehicle capacity, and decreases complexity, due to removal of a robot from the guided vehicle.

PGV 357 (FIG. 15A) is obtained by one or more of the above-described modifications, and has a handle 358 used for manually pushing the PGV 357. The PGV 357 shown in FIG. 15A includes only one buffer apparatus, but it need not be limited to one buffer apparatus. The number of buffer apparatuses typically used in PGV 357 can vary one to twelve depending on the capability of the operator required to push the PGV 357 or the power-assist system employed. A rail 360 guides RGV 359 in FIG. 15B. The RGV 359 shown consists of two buffer apparatuses, but it is not limited to two buffer apparatuses. The number of buffer apparatuses typically used in RGV 359 can vary from one to twelve. In FIG. 15C the AGV 361 is guided by an autonomous system (not shown). The AGV 361 shown consists of four buffer apparatuses, but it is not limited to four buffer apparatuses. The number of buffer apparatuses typically used in the AGV 361 can vary from one to twelve.

Note that a guided vehicle may be obtained by replacing a moving mechanism built into one embodiment of a buffer apparatus with a driven wheeled mechanism or a freewheeling mechanism of the type used in a guided vehicle.

Figure 16:
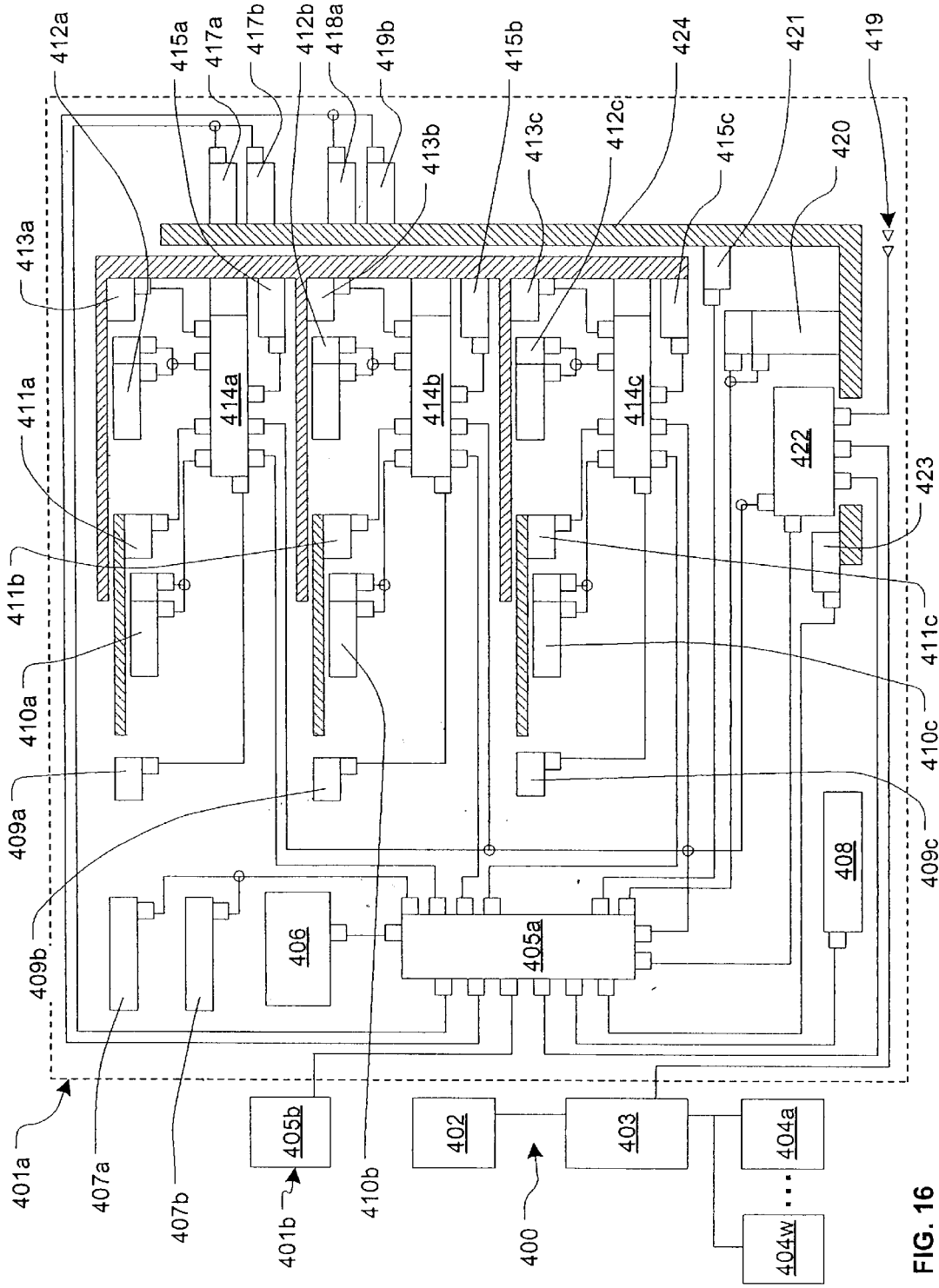
FIG. 16 illustrates, in a block diagram, electrical circuitry used in one embodiment of a buffer apparatus.

FIG. 16 depicts a control system diagram for a buffer system 400. Two buffer apparatus 401a and 401b with 401a shown in detail. The buffer controller 405 of buffer apparatus 401a is the master controller between the two buffer apparatus 401a and 401b. The equivalent buffer controller 405b with buffer apparatus 401b, acts as a slave to the buffer controller 405a. The master buffer controller 405a communicates with the processing system controller 403, which in turn communicates with AMHS 402 and the box opener/loaders 404a through 404w. Typically, one or two box opener/loaders would communicate with the processing system controller 403 when used in a buffer system 400.

Also, FIG. 16 depicts the detailed control system of a buffer apparatus 401a. At the center of the control system is the buffer controller 405a. The buffer controller 405a outputs information to be displayed on the buffer user interface 406 (also called "UI"). In addition, the buffer controller 405a receives and send information to the bar code reader 408, used to identify a carrier within a buffer apparatus. In addition to the above mentioned components, the buffer controller 405a receives signals from a variety of sensors which include: buffer load port carrier presence sensor 407a; buffer load port carrier seated sensor 407b; upper transfer position, top sensor 417a; upper transfer position, bottom sensor 417b; lower transfer position, top sensor 418a; a lower transfer position, bottom sensor 418b; vertically moving mechanism home sensor 421; and a safety sensor 423. The buffer controller 405a also interacts with the buffer facilities panel 422 for communication and power. Power is supplied to the buffer apparatus 401a via a power connection 419 from the fab. The facilities panel 422 also connects the buffer apparatus 401a to the processing system controller 403. Lastly, the buffer controller 405a controls the vertically moving mechanism motor 420.

The control system of a single horizontally moving mechanism (also called "HMM") consists of a single slave controller 414a–c. A single HMM controller 414a–c controls the twin motors 410a–c and 412a–c for a single HMM. In addition the HMM controller 414a–c receives sensor inputs which include: carrier seated in end effector sensor 409a–c; HMM outer stage retracted sensor 411a–c; HMM inner stage retracted sensor 413a–c; cassette presence sensor 415a–c.

Several of the embodiments described herein utilize available space adjacent to a processing station load port, thereby increasing the storage capability of the processing station without increasing the footprint of the processing station (area occupied by the processing station measured in terms of floor space) as depicted in FIGS. 6E, 7A–7J, 12A–12C, 13A–13D, and 14.

Depending on the embodiment, the processing system that a buffer apparatus (of the type described herein) services could have just a single process chamber, or it could be a device, such as a chemical mechanical polisher, that does not include any processing chambers as in, but not limited to, U.S. Pat. Nos. 5,435,682; 6,267,853; 6,298,685; 6,336,845; or 6,339,730. In addition, the processing system could perform metrology or inspection instead of or in addition to the fabrication steps. Finally, the processing system could perform transfer steps such as transfer of substrates from one carrier to another or from one carrier to a processing system as in, but not limited to, wafer sorters, cassette transfer devices as depicted in U.S. Pat. No. 5,807,062.

Although a load port 21 has been described above as being part of buffer apparatus 20, in other embodiments such a shelf may be part of another apparatus that is used in combination with buffer apparatus 20. In certain embodiments, the above-described arrangement of shelves is reversed, wherein a box opener/loader has a shelf at the upper transfer position, and buffer apparatus has a shelf at the lower transfer position. In various embodiments, both shelves may be included in a box opener/loader, or alternatively both shelves may be included in a buffer apparatus, depending on the embodiment.

Although a buffer apparatus 20 has been described being rigidly mounted to the cleanroom floor, in alternative embodiments the buffer apparatus maybe rigidly mounted to the cleanroom wall, the processing system front face, or the cleanroom ceiling.

In another embodiment, an arrayed buffer system comprising one or more buffer systems used to transfer carriers to and from a processing system comprising a process apparatus to perform a fabrication step on a substrate comprising an interface wall separating the processing apparatus from a cleanroom; an opening in the interface wall; a box opener/loader; an EFEM capable of transferring the substrate through the opening between the box opener/loader and the processing apparatus as in FIGS. 12A–12B.

Yet another embodiment, an arrayed buffer system comprising one or more buffer systems used to transfer said carriers to and from a processing system comprising a metrology apparatus to perform a metrology step on a substrate comprising an interface wall separating the metrology apparatus from a cleanroom; an opening in the interface wall; a box opener/loader; an EFEM capable of transferring the substrate through the opening between the box opener/loader and the metrology apparatus as in FIGS. 12A–12B.

In an additional embodiment, an arrayed buffer system comprising one or more buffer systems used to transfer said carriers to and from a processing system comprising a substrate transfer apparatus to perform a transfer step on a substrate comprising an interface wall separating the substrate transfer apparatus from a cleanroom; an opening in the interface wall; a box opener/loader; an EFEM capable of transferring the substrate through the opening between the box opener/loader and the substrate transfer apparatus as in FIGS. 12A–12B.

Yet, in another embodiment, an arrayed buffer system capable of receiving a carrier from and presenting a carrier to an overhead vehicle or a conveyor system onto the uppermost buffer load ports as in FIGS. 12C, 13A, 13C.

In another embodiment, an arrayed buffer system capable of receiving a carrier from and presenting a carrier to a personal guided vehicle, an automated guided vehicle, or a rail guided vehicle onto a buffer load port or the box opener/loader as in FIGS. 12C, 13A, 13C.

Still, in another embodiment, an arrayed buffer system capable of simultaneously receiving a carrier from and presenting a carrier to an overhead vehicle on the uppermost load port and to one the following: a personal guided vehicle, an automated guided vehicle, or a rail guided vehicle, onto a remaining buffer load ports or the box opener/loader as in FIG. 13C.

In another embodiment, an arrayed buffer system comprising one or more buffer systems where said buffer systems share one set of load ports consisting of one box opener/loader and a set of buffer load ports as in FIG. 12B.

Further, in an embodiment, an arrayed buffer system capable of being serviced from at a minimum the front of the buffer apparatus while being docked as in FIG. 13C.

Still, in another embodiment, a combination of arrayed buffer systems comprising a plurality of adjacent arrayed buffer systems capable of sharing a single, EFEM, maintenance width as in FIGS. 13B and 13D.

Additionally, a combination of arrayed buffer systems of capable of being serviced from the front of the combination of arrayed buffer systems while docked is an embodiment as in FIG. 13C.

A further embodiment consists of a combination of arrayed buffer systems comprising a plurality of adjacent arrayed buffer systems capable of receiving a carrier from and presenting a carrier to an overhead vehicle or a conveyor system onto the uppermost buffer load ports as in FIGS. 12C, 13A, 13C.

Another embodiment consists of a combination of arrayed buffer systems comprising a plurality of adjacent arrayed buffer systems capable of receiving a carrier from and presenting a carrier to a personal guided vehicle, an automated guided vehicle, or a rail guided vehicle onto a buffer load port or said processing system load port as in FIGS. 12C, 13A, 13C.

In yet another embodiment, a combination of arrayed buffer systems comprising a plurality of adjacent arrayed buffer systems is capable of simultaneously receiving a carrier from and presenting a carrier to an overhead vehicle on said uppermost load port and to one the following: a personal guided vehicle, an automated guided vehicle, or a rail guided vehicle, onto said remaining buffer load ports or said processing system load port as in FIG. 13C.

A further embodiment consist of a buffer apparatus used to store carriers and transfer carriers to and from a load port, said buffer apparatus comprising, a vertically moving mechanism such that said vertically moving mechanism comprises a plurality of horizontally moving mechanisms for storing and transferring a corresponding plurality of carriers to and from a load port; one or more buffer load ports comprising a set of buffer load ports lateral to the vertically moving mechanism used to charge or uncharge said vertically moving mechanism; a fixedly mounted frame supporting said vertically moving mechanism and said buffer load port where said frame is adjacent and coupled by means of a docking mechanism to the cleanroom floor, cleanroom wall, processing system, or cleanroom ceiling; and an opening in the floor allowing for said vertically moving mechanism to index below the floor level as in FIG. 14.

A personal guided vehicle, rail guided vehicle, or automated guided capable of transferring carriers to and from a load port fixed to an adjacent apparatus comprising: one or more vertically moving mechanisms such that said vertically moving mechanism comprises a plurality of horizontally moving mechanisms for storing and transferring a corresponding plurality of carriers; a fixedly mounted frame supporting said vertically moving mechanism where said frame is attached to a personal, movable apparatus as in FIGS. 15A–15C.

In a final embodiment, the buffer load ports may be pivoted out of the way to remove them from the path vertically above the box opener/loader allowing a carrier to be placed directly on the box opener/loader.

Accordingly numerous such modifications and adaptations of the embodiments, implementations and examples described herein are encompassed by the attached claims.

What is claimed is:

1. An apparatus comprising:
   a plurality of first mechanisms capable of horizontally moving through a first distance;
   a second mechanism capable of moving vertically through a second distance, each first mechanism in the plurality being mounted on the second mechanism; and
   a frame comprising a foot on which the second mechanism is fixedly supported, the frame further comprising a shelf fixedly attached to the foot by a support, the shelf having three pins arranged to form a kinematic mount capable of capturing a carrier in a repeatable fashion, wherein the kinematic mount is horizontally separated from the foot by approximately the first distance and the kinematic mount is vertically separated from the foot by approximately the second distance.

2. The apparatus of claim 1, wherein each first mechanism comprises:
   a guide mechanism;
   a drive mechanism guided by the guide mechanism; and
   a carrier receiver mounted at an end of the drive mechanism.

3. The apparatus of claim 2, wherein the carrier receiver comprises a forked end effector.

4. The apparatus of claim 1, wherein the vertically moving mechanism comprises a guide mechanism and a drive mechanism.

5. The apparatus of claim 1 further comprising a kinematic mount attached to an upper surface of the shelf.

6. The apparatus of claim 1 wherein the foot comprises:
a cleanroom floor-mounted part of a docking mechanism.

7. The apparatus of claim 1 wherein the foot comprises:
slide mechanism including at least one item selected from a group consisting of casters and skids.

8. The apparatus of claim 1 wherein the foot comprises:
at least one mechanism selected from a group consisting of a freewheeling mechanism and a driven wheeled mechanism.

9. A method of storing a plurality of carriers adjacent to a processing station, the method comprising:
vertically moving a carrier to be included in a vertical stack of said plurality of carriers, from an overhead transport to an upper load port;
horizontally transferring the carrier from upper load port to a column of space in a buffer apparatus adjacent to the processing station, thereby to form at least a portion of said vertical stack within said column of space;
vertically moving said vertical stack of said plurality of carriers including said carrier at least within the column of space in said buffer apparatus;
horizontally transferring the carrier from the column of space to a lower load port that is located vertically underneath the upper load port, thereby to remove the carrier from said vertical stack within said column of space in said buffer apparatus.

10. The method of claim 9 further comprising:
transferring another carrier from the lower load port to a personal guided vehicle (PGV), an automated guided vehicle (AGV), or a rail guided vehicle (RGV).

11. The method of claim 9 wherein the column of space is enclosed within a buffer apparatus, and the method further comprising:
docking the buffer apparatus to the processing station; and
servicing the buffer apparatus from the front while docked.

12. The method of claim 9 further comprising:
opening the carrier at the lower port.

13. A system comprising:
a box opener/loader having a load port; and
an apparatus located adjacent to the box opener/loader, the buffer apparatus comprising a plurality of first mechanisms capable of horizontally moving through a first distance, a second mechanism supporting each first mechanism and capable of moving each first mechanism vertically through a second distance, the second mechanism being fixedly supported on a foot of the apparatus, the apparatus further comprising a first shelf fixedly attached to the foot by a support, the shelf having three pins arranged to form a kinematic mount capable of capturing a carrier in a repeatable fashion, wherein the kinematic mount is horizontally separated from the foot by approximately the first distance and the kinematic mount is vertically separated from the foot by approximately the second distance;
wherein a transfer position for the apparatus is at a second shelf of the box opener/loader, and the second distance is larger than the vertical distance between the foot and the second shelf.

14. The system of claim 13 wherein the buffer apparatus is placed adjacent to the box opener/loader such that said load port is the processing system load port and the buffer apparatus has an additional load port formed by the kinematic mount and located above the processing system load port.

15. The system of claim 13 wherein the load port is capable of receiving a carrier from and presenting a carrier to an overhead vehicle (OHV).

16. The system of claim 13 wherein the load port is capable of receiving a carrier from and presenting a carrier to a vehicle selected from a group consisting of a personal guided vehicle (PGV), an automated guided vehicle (AGV), and a rail guided vehicle (RGV).

17. A The system of claim 13 comprising a plurality of load ports capable of simultaneously receiving a carrier from and presenting a carrier to an overhead vehicle on said uppermost load port and to: a vehicle selected from a group consisting of a personal guided vehicle (PGV), an automated guided vehicle (AGV), and a rail guided vehicle (RGV).

* * * * *